US012676606B2

(12) United States Patent
Nedalgi et al.

(10) Patent No.: US 12,676,606 B2
(45) Date of Patent: Jul. 7, 2026

(54) TRANSISTOR OVER-VOLTAGE PROTECTION

(71) Applicant: Intel Corporation, Santa Clara, CA (US)

(72) Inventors: Dharmaray Nedalgi, Bangalore (IN); Lavanya Manohar Nirikhi, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/993,412

(22) Filed: Nov. 23, 2022

(65) Prior Publication Data

US 2024/0088887 A1     Mar. 14, 2024

Related U.S. Application Data

(60) Provisional application No. 63/405,796, filed on Sep. 12, 2022.

(51) Int. Cl.
*H03K 17/082* (2006.01)

(52) U.S. Cl.
CPC . *H03K 17/0822* (2013.01); *H03K 2217/0081* (2013.01)

(58) Field of Classification Search
CPC ....... H03K 17/0822; H03K 2217/0081; H03K 17/102
See application file for complete search history.

(56) References Cited

U.S. PATENT DOCUMENTS

| | | | |
|---|---|---|---|
| 6,313,672 B1* | 11/2001 | Ajit | H03K 19/00315 |
| | | | 326/27 |
| 10,461,964 B1* | 10/2019 | Cherkassky | H04L 25/0276 |
| 10,693,450 B2 | 6/2020 | Nedalgi et al. | |
| 2003/0122606 A1* | 7/2003 | Ajit | H03K 17/0822 |
| | | | 327/309 |
| 2010/0231267 A1* | 9/2010 | Scott | H03K 19/018507 |
| | | | 327/108 |
| 2013/0285708 A1* | 10/2013 | Kumar | G11C 7/1069 |
| | | | 327/108 |
| 2014/0292379 A1* | 10/2014 | Itonaga | H03K 19/00 |
| | | | 327/109 |
| 2015/0229297 A1* | 8/2015 | Kwon | H03K 17/687 |
| | | | 327/108 |
| 2016/0105183 A1* | 4/2016 | Kim | H03K 19/00315 |
| | | | 327/333 |

\* cited by examiner

*Primary Examiner* — Thienvu V Tran
*Assistant Examiner* — Muaamar Qahtan Al-Taweel
(74) *Attorney, Agent, or Firm* — NICHOLSON DE VOS WEBSTER & ELLIOTT LLP

(57) ABSTRACT

An apparatus comprises a first supply node to provide a first voltage and a second supply node to provide a second voltage lower than the first voltage. First and second transistors, of a first conductivity type, are coupled in series at a first common node, wherein the first transistor is coupled to the first supply node, and the second transistor is coupled to an output node. Third and fourth transistors, of a second conductivity type, coupled in series at a second common node, wherein the fourth transistor is coupled to a third node that is to provide a third voltage, and the third transistor is coupled to the output node. First impedance circuitry is coupled to a gate terminal of the second transistor, the second supply node, and to a gate terminal of the first transistor.

18 Claims, 9 Drawing Sheets

TRANSISTOR OVER-VOLTAGE PROTECTION

CLAIM OF PRIORITY

This application claims the benefit of the filing date of U.S. Provisional Patent Application Ser. No. 63/405,796, filed Sep. 12, 2022, and titled "TRANSISTOR OVER-VOLTAGE PROTECTION," which is incorporated herein by reference in its entirety.

BACKGROUND

Various junctions are defined across the terminals of a transistor. For example, a field-effect transistor (FET) has drain-to-source (DS), drain-to-gate (DG), gate-to-source (GS), and gate-to-bulk (GB) junctions. Maximum device junction voltages are defined for a particular process technology. A transistor junction is stressed when the voltage across the junction repeatedly exceeds the maximum design voltage. Stress resulting from repeated over-voltage conditions can result in hot carrier injection, dielectric breakdown, or both. Over-voltage stress on transistor junctions can result in reduced device lifetime and, in some cases, failure of an entire system.

Over-voltage stress may be static or dynamic. Both static and dynamic over-voltage stress may lead to transistor and circuit degradation. Over time over-voltage stress may eventually result in circuit breakdown.

One class of circuits where over-voltages at device junctions may appear are circuits using stacked devices where the voltage across the stack is higher than maximum voltages specified for the individual devices in the stack. Some examples of high voltage circuits are high-voltage I/O cells, power amplifiers, and DC-DC converters.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Over-voltage stress on transistor junctions can reduce device lifetime. In particular, transistors fabricated as Fin-FET (fin field effect transistor) structures can be more susceptible to over-voltage stress than those fabricated as planar structures. Further, as transistors are fabricated at smaller geometries, their susceptibility to over-voltage stress increases.

One class of circuits where over-voltage stress may appear are circuits using stacked devices where the voltage across the stack is higher than a maximum voltage specified for the individual devices in the stack. It would be advantageous to limit or prevent occurrences of the voltage across transistor junctions exceeding the maximum design voltage in circuits containing two or more transistors in a stack, especially where the transistors are FinFET devices.

Figure 1:
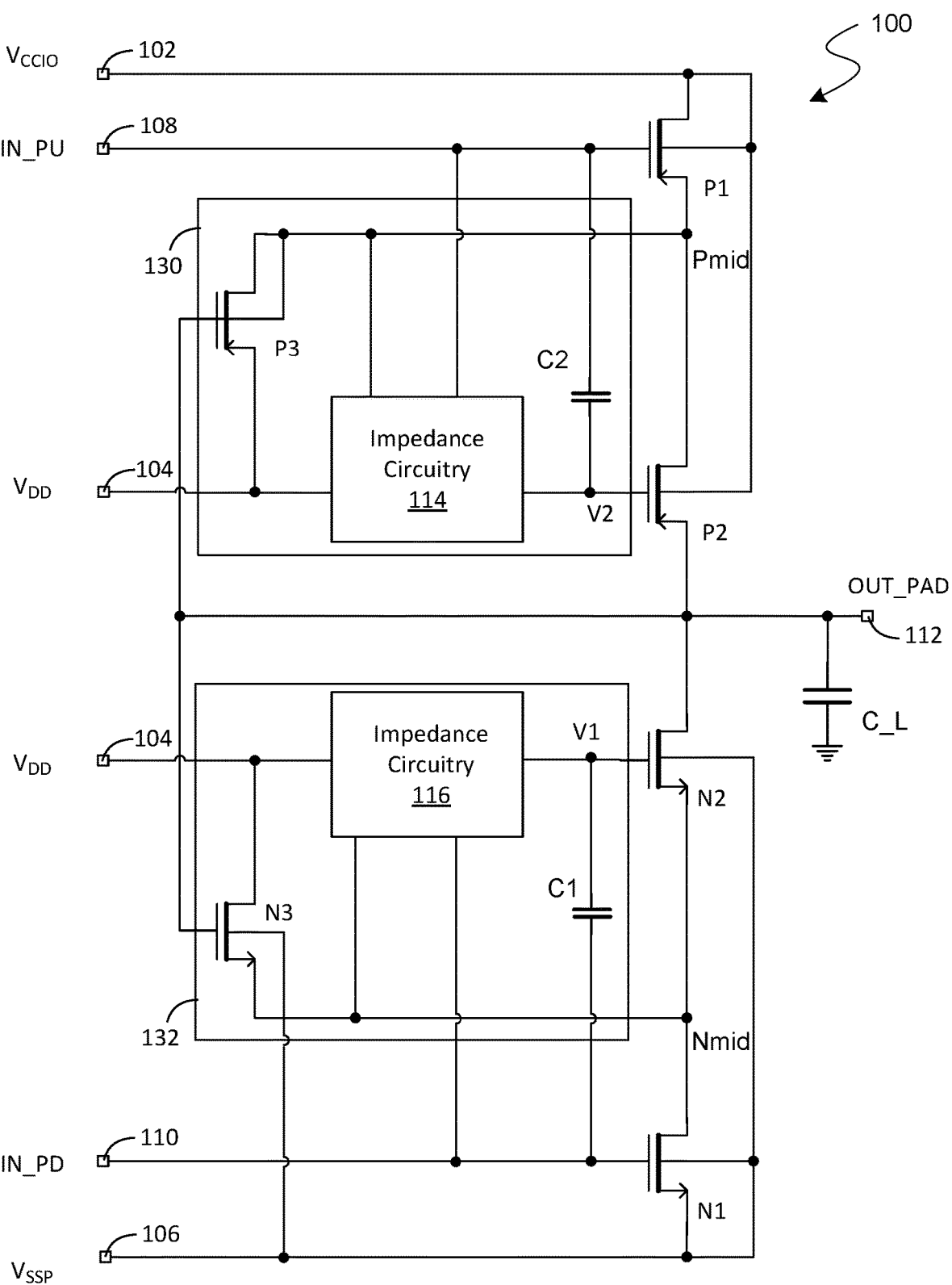
FIG. 1 is a schematic diagram of a dual-stacked high voltage driver circuit comprising over-voltage protection circuitry according to various embodiments.

FIG. 1 shows an example of a dual-stacked high voltage driver circuit 100 comprising circuitry to limit or prevent occurrences of over-voltage stress according to various embodiments. The circuit 100 comprises a first supply node 102, a second supply node 104, and a third node 106. A first voltage $V_{CCIO}$ is provided at the first supply node 102 and a second voltage $V_{DD}$ is provided at the second supply node 104. (In the figure, two instances of the second supply node 104 are shown.) The second voltage $V_{DD}$ is lower than the first voltage $V_{CCIO}$. In an embodiment, the first voltage is twice as high as the second voltage. For example, the first voltage can be 3.3V, while the second voltage can be 1.65V. A third voltage is provided at the third node 106. The third voltage $V_{SSP}$ can be a supply voltage, a ground potential, or the like. In an embodiment, the second voltage is higher than the third voltage $V_{SSP}$. For example, the second voltage can be 1.65V, while the third voltage can be 0V.

The circuit 100 comprises first and second input nodes 108 and 110 to respectively receive a first input signal IN_PU and a second input signal IN_PD. The circuit 100 comprises an output node 112, where an output signal OUT_PAD is provided. The high voltage driver circuit 100 comprises a first stack of transistors of a first conductivity type and a second stack of transistors of a second conductivity type. In the example, a load capacitance is represented by a capacitor C_L coupled with the output node 112.

In an embodiment, the first stack includes transistors P1 and P2 of a P-conductivity type. P1 and P2 may be FinFET or planar transistors. Transistors P1 and P2 are coupled in series at a first common node Pmid. Transistor P2 is coupled with P1 in a cascode arrangement. Transistor P1 is coupled to receive the first supply voltage $V_{CCIO}$ at a source/drain terminal. The gate of P1 is coupled with the input signal IN_PU. A source/drain terminal of transistor P2 is coupled with output node 112. The gate of P2 is coupled with the second supply node 104 via circuitry 114. The substrates of P1 and P2 may be coupled with the first supply voltage $V_{CCIO}$.

In an embodiment, the second stack includes transistors N1 and N2 of an N-conductivity type. N1 and N2 may be FinFET or planar transistors. Transistors N1 and N2 are coupled in series at a second common node Nmid. Transistor N2 is coupled with N1 in a cascode arrangement. Transistor N1 is coupled to receive the third voltage $V_{SSP}$ at a source/drain terminal. The gate of N1 is coupled with the input signal IN_PD. A source/drain terminal transistor N2 is coupled with output node 112. The gate of N2 is coupled with the second supply node 104 via circuitry 116. The substrates of N1 and N2 may be coupled with third voltage $V_{SSP}$.

The voltage driver circuit 100 also includes a first circuitry unit 130 comprising a feedback transistor P3, a capacitor C2, and impedance circuitry 114. The voltage driver circuit 100 also includes a second circuitry unit 132 comprising a feedback transistor N3, a capacitor C1, and impedance circuitry 116.

In an embodiment, the first capacitor, e.g., capacitor C2, is coupled with a gate terminal of a first transistor, e.g., transistor P1, and the gate terminal of a second transistor, e.g., transistor P2. In addition, the second capacitor, e.g., capacitor C1, is coupled with a gate terminal of a fourth transistor, e.g., transistor N1, and the gate terminal of a third transistor, e.g., transistor N2.

In an embodiment, the first feedback transistor P3 is coupled to the common node Pmid and to the second supply node 104. The first feedback transistor P3 is of the P conductivity type. A gate terminal of P3 is coupled to the output node 112. The second feedback transistor N3 is coupled to the common node Nmid and to the second supply node 104. The second feedback transistor N3 is of the N conductivity type. A gate terminal of N3 is coupled to the output node 112.

The impedance circuitry 114 is coupled to the gate terminal of P2 (denoted V2 in the figure) and the second supply node 104. In some embodiments, the impedance circuitry 114 is also coupled common node Pmid and a gate terminal of transistor P1. The impedance circuitry 116 is coupled to a gate terminal of N2 (denoted V1 in the figure) and the second supply node 104. In some embodiments, the impedance circuitry 116 is also coupled to common node Nmid, and a gate terminal of N1.

Before describing the roles of capacitors C1 and C2, feedback transistors P3 and N3, and the circuitries 114 and 116 of the voltage driver circuit 100, the operation of voltage driver circuit 100 without these components is described. The circuit 100 operates at the supply voltage, $V_{CCIO}=2\times V_{DD}$, resulting in a voltage swing at output node 112 between 0V to $2\times V_{DD}$. However, the particular process technology may limit the device junction voltages to less than $2\times V_{DD}$. For example, the voltages at junctions $V_{DS}$ (drain to source), $V_{GS}$ (gate to source) and $V_{GD}$ (gate to drain) of transistors P1, P2, N1, and N2 may be limited to $V_{DD}$. As noted, repeatedly exceeding the device junction voltage limit Vmax may result degradation of the device. An advantage of feedback transistors P3 and N3, capacitors C1 and C2, and circuitries 114 and 116 is that they prevent, limit, or reduce the time at which, the device junction voltages of P2 and N2 exceed Vmax.

Without the capacitors C1 and C2, feedback transistors P3 and N3, and the circuitries 114 and 116, the cascode driver transistors P2 and N2 would experience over-voltage stress.

In a first example of static over-voltage stress, when the first input signal IN_PU and the second input signal IN_PD are each a logic 0, e.g., 0V, transistor P1 turns on and transistor N1 turns off. This results in the first stack pulling the output node 112 to a logic high, e.g., 3.3V. Without feedback transistor P3 and impedance circuitry 116, node Nmid would be at $V_{DD}-V_{THN2}$ while output OUT_PAD would be at $2\times V_{DD}$. As a consequence, $V_{DS}$ across N2 would equal $V_{DD}+V_{THN2}$, which exceeds Vmax of $V_{DD}$, resulting in static over-voltage stress to N2.

In a second example of static over-voltage stress, when the first input signal IN_PU and the second input signal IN_PD are each at logic 1, transistor P1 turns off and transistor N1 turns on. This results in the second stack pulling the output node 112 to a logic low, e.g., 0V. Without feedback transistor P3 and circuitry 114, node Pmid would be at $V_{DD}+V_{THP2}$ while output OUT_PAD would be at 0V. As a consequence, $V_{DS}$ across $P2=V_{DD}+V_{THP2}$, which exceeds Vmax of $V_{DD}$, resulting in static over-voltage stress to P2.

Because the capacitive load C_L at the output 112 is usually significantly larger than the capacitance at the common nodes Nmid and Pmid, transistors N2 and P2 can also experience dynamic over-voltage stress in the absence of feedback transistors P3 and N3, capacitors C1 and C2 and circuitries 114 and 116.

In a first example of dynamic over-voltage stress, when the first input signal IN_PU and the second input signal IN_PD transition from a logic 0 to a logic 1, and output node 112 transitions from 3.3V to 0V, the node Nmid would discharge through N1 at a higher rate than the output node OUT_PAD discharges, if feedback transistor N3, capacitor C1 and impedance circuitry 116 were excluded from the voltage driver circuit 100. Because of the difference in discharge rates, the voltage across the $V_{DS}$ junction of N2 would temporarily exceed voltage limit Vmax.

In a second example of dynamic over-voltage stress, when the first input signal IN_PU and the second input signal IN_PD transition from a logic 1 to a logic 0, and output node OUT_PAD transitions from 0V to 3.3V, the node Pmid would be charged through P1 at a higher rate than the output node OUT_PAD is charged, if feedback transistor P3, capacitor C2 and impedance circuitry 114 were excluded from the voltage driver circuit 100. Because of the difference in charge rates, the voltage across the $V_{DS}$ junction of P2 would temporarily exceed voltage limit Vmax.

Figures 2A, 2B, 2C:
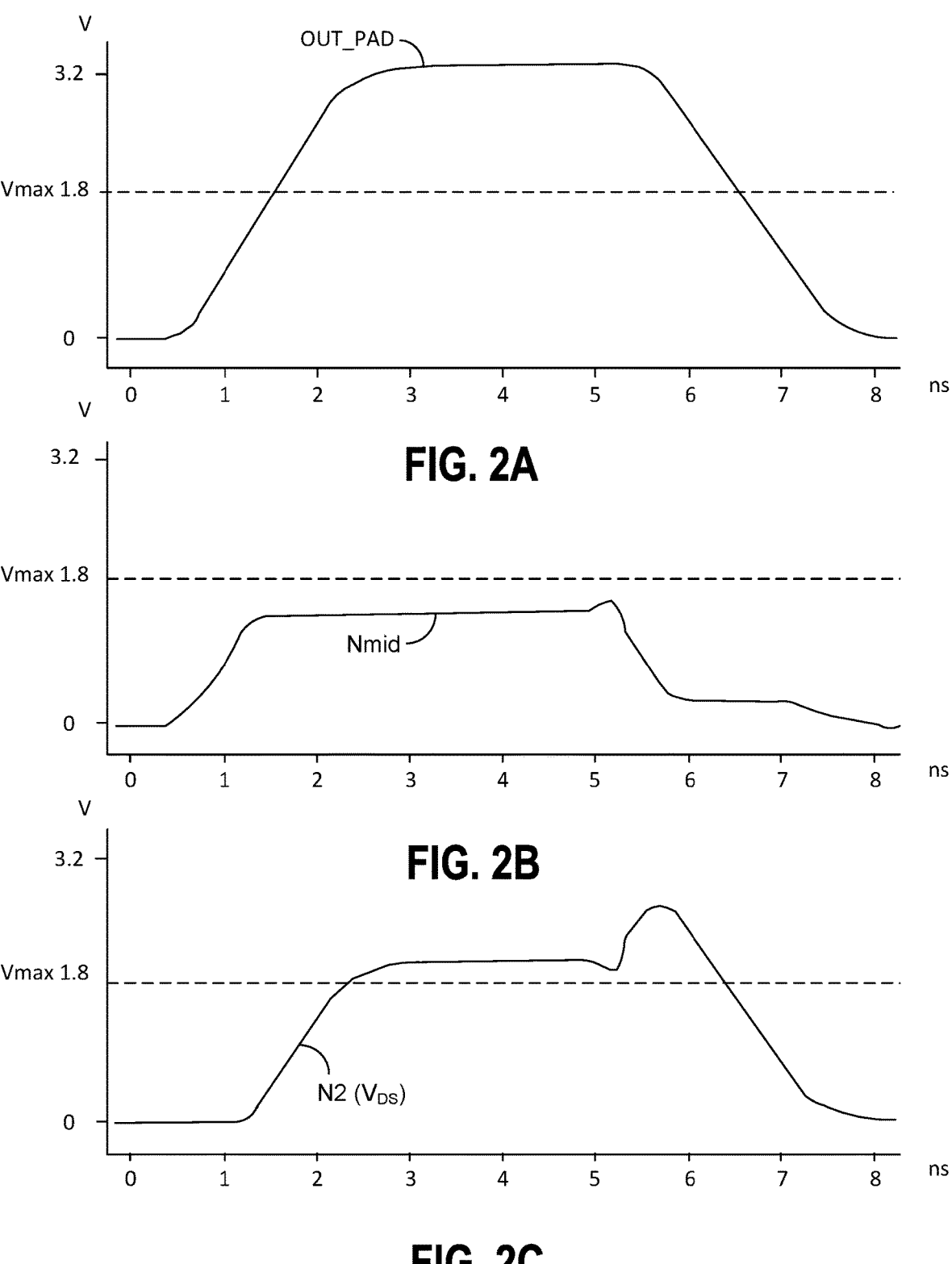
FIGS. 2A to 2C illustrate example waveforms for a dual stacked high voltage driver circuit.

FIGS. 2A to 2C present example waveforms for the dual stacked high voltage driver circuit of FIG. 1, illustrating static and dynamic over-voltage stress across the $V_{DS}$ junction of N2 that would occur without inclusion of feedback transistor N3, capacitor C1 and circuitry 116 in voltage driver circuit 100. In this example, the device junction voltage limit Vmax equals 1.8V. FIG. 2A shows the voltage at output node 112. FIG. 2B shows the voltage at common node Nmid. FIG. 2B shows the voltage $V_{DS}$ across the drain and source of transistor N2.

When the input signals IN_PU and IN_PD are at a logic low, P1 is on, N1 is off, and the output node 112 is at 3.3V. Referring to FIG. 2A, it can be seen that OUT_PAD at output node 112 is at 3.3V starting at about 2.5 ns. Referring to FIG. 2B, the node Nmid is at $V_{DD}-V_{THN2}$ at time 2.5 ns. As a consequence, $V_{DS}$ across N2 equals $V_{DD}$ $V_{THN2}$. Referring to FIG. 2C, it can be seen that $V_{DS}$ across N2 exceeds Vmax. FIG. 2C shows static over-voltage stress to N2 when the output node 112 is high, from at about 2.5 ns to about 5 ns.

When the input signals IN_PU and IN_PD start a transition from logic low to logic high, P1 starts to turn off, and N1 starts turn on, and the output node 112 starts to change from 3.3V to 0V. Referring to FIG. 2A, it can be seen that the output node 112 starts to fall at about 5.5 ns. However, referring to FIG. 2B, it can be seen that the voltage at Nmid starts falling immediately. Moreover, it can be seen that the voltage at Nmid falls faster than the voltage at output node 112. This difference in discharge rates is due to the capacitive load difference between the common node Nmid and the output node 112. As can be seen in FIG. 2C, the result is that $V_{DS}$ of transistor N2 goes above the device junction limit of 1.8V, peaking at about 2.5V, in the time period between about 5.0 ns and about 6.5 ns. The $V_{DS}$ of transistor N2 goes above the device junction limit, increasing from the static overvoltage level, until the OUT_PAD voltage falls enough to bring $V_{DS}$ of N2 back within the device junction limit Vmax. During the period from about 5.0 ns and about 6.5 ns, transistor N2 experiences dynamic over voltage stress. Similarly, P2 can have dynamic over-voltage stress during high to low transitions of the input signals.

Embodiments address device degradation due to hot carrier injection during switching that affects device lifetime. In addition, various embodiments address the effects of over-voltage stress on gate oxide, which may lead to device breakdown over the device's lifetime. Advantageously, embodiments do not consume any static current other than device leakage, and may maintain the voltage across terminals ($V_{GD}$, $V_{GS}$, $V_{DS}$) of devices within device limits, e.g., 1.8V, during both static and dynamic conditions.

According to various embodiments, a nonstationary bias voltage is generated to dynamically control node impedance without any static power, which may prevent both static and dynamic over voltage stress conditions on cascode transistors, e.g., N2 and P2. In an embodiment, a non-stationary bias voltage is applied to stacked driver cascode transistors. At the onset of a transition from high-to-low for an NMOS driver, a voltage boost is provided. At the onset of a transition from low-to-high for PMOS driver, a voltage dip is provided. This results in a controlled charging/discharging of the common nodes Nmid and Pmid coupled to the cascoded driver transistors.

In embodiments, the gate node of a stacked driver, e.g., N2 and P2, is made a high impedance node only during transitions. This results in very good coupling using a relatively small capacitor value in comparison to other techniques. Making the gate node high impedance only during transitions also addresses dynamic over-voltage stress. After a transition, the gate node of the stacked driver is changed back to low impedance, such that the gate node is at fixed bias. Changing the gate node back to a fixed bias avoids over-voltage stress on the drain-to-source junction under static conditions. Embodiments thus confine transistor junction voltages to within device limits and prevent gate oxide over stress and hot carrier induced degradation of devices.

The temporary boosting or dipping of voltages is timed with driver switching and provides the required enhancement of $V_{GS}$ only when needed to avoid any excessive drain-source voltage $V_{DS}$ to the devices connected to the output node 112. Embodiments may be particularly beneficial or useful in finFET technology where device reliability can be a challenge.

Figure 3:
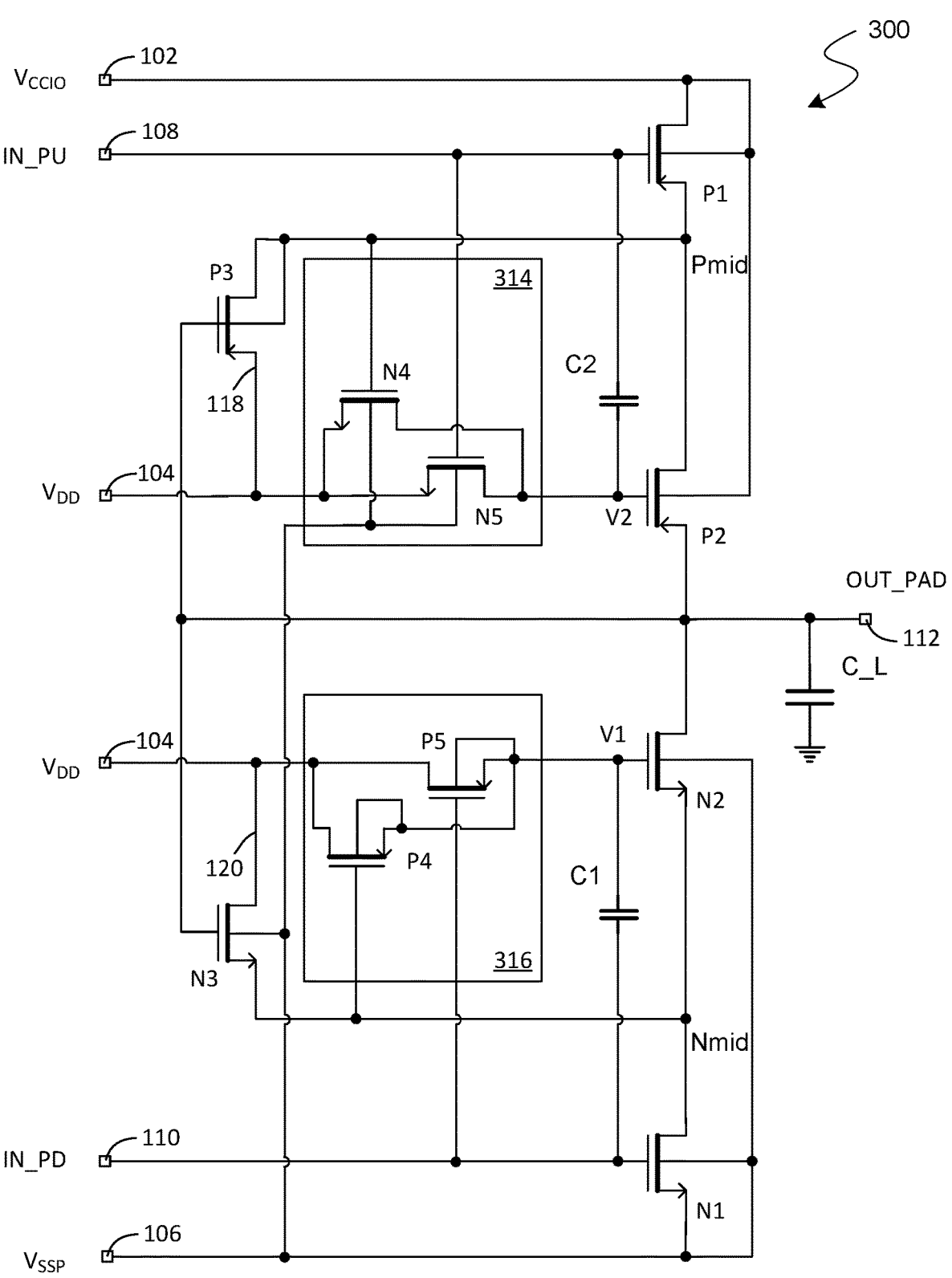
FIG. 3 is a schematic diagram of a dual-stacked high voltage driver circuit comprising over-voltage protection circuitry according to various embodiments.

FIG. 3 is a schematic diagram of a dual-stacked high voltage driver circuit 300 comprising various over-voltage protection circuitry in accordance with some embodiments. The example of FIG. 3 is a 3.3V IO buffer using 1.8V devices. Circuit 300 provides high voltage (3.3V) signaling using low voltage (1.8V) devices. Voltage driver circuit 300 comprises the first supply node 102, second supply node 104, third input node 106, first input node 108, second input node 110, and output node 112, which may be the same as the example circuit 100 of FIG. 1. Voltage driver circuit 300 comprises the first stack transistors (P1 and P2) and the second stack of transistors (N1 and N2), which may be the same as and connected in the same way as the example circuit 100 of FIG. 1. Voltage driver circuit 300 comprises the feedback transistors P3 and N3, and capacitors C1 and C2, which may be the same as and connected in the same way as the example circuit 100 of FIG. 1. Voltage driver circuit 300 also comprises impedance circuitry 314 and 316, which are described below. Advantageously, voltage driver circuit 300 may use relatively low static power and may provide relatively high device lifetimes.

The impedance circuitry 314 is coupled to the gate terminal of P2 (denoted V2 in the figure), the second supply node 104, the common node Pmid, and a gate terminal of P1. In an embodiment, the impedance circuitry 314 comprises a transistor N4 and a transistor N5, which are of an N conductivity type. The transistor N4 is coupled to the gate terminal of P2 (V2) and the second supply node 104. The gate terminal of N4 is coupled to the common node Pmid. The transistor N5 is coupled to the gate terminal of P2 (V2) and the second supply node 104. The gate terminal of N5 is coupled to the gate terminal of P1 or first input node 108.

The impedance circuitry 316 is coupled to a gate terminal of N2 (denoted V1 in the figure), the second supply node 104, the common node Nmid, and a gate terminal of N1. In an embodiment, the impedance circuitry 316 comprises a transistor P4 and a transistor P5, which are of a P conductivity type. The transistor P4 is coupled to the gate terminal of N2 (V1) and the second supply node 104. The gate terminal of P4 is coupled to the common node Nmid. The transistor P5 is coupled to the gate terminal of N2 (V1) and the second supply node 104. The gate terminal of P5 is coupled to the gate terminal of N1 or second input node 110.

Operation of the circuit 100 is explained below. In an example, the IO voltage (VCCIO=2×$V_{DD}$) is taken to be=3.3V and the $V_{DD}$ voltage (bias voltage to the cascoded driver devices P2 and N2) is taken to be=1.65V. First, transmitting a logic high is described. Second, transmitting a logic low is described.

Transitioning Output to a Logic High

In a transition of the output to a logic high, IN_PU is changed from high ($V_{DD}$) to low (0V) by a pre-driver circuit (not shown). The pre-driver circuit level translates the input signal from 2×VDD to VDD (IN_PU) at input node 108. The signal IN_PU at input node 108 drives the gate of transistor P1, turning P1 on.

At the start of the transition, transistor N4 is off. The falling voltage at node 108 (gate of N5) turns off transistor N5. With N4 and N5 off, the gate of P2 (V2) is isolated from the second supply node 104 ($V_{DD}$), which make V2 a high impedance node. Several aspects should be noted. First, the falling voltage at the gate of transistor P1 couples well through capacitor C2 to high impedance node V2. Second, turning off N5, together with the coupling through capacitor C2, causes the gate voltage for P2 (V2) to dip for a short duration, which provides the required $V_{GS}$ to transistor P2, enabling P2 to turn on at the same time that transistor P1 is turned on. Third, the short duration dip in voltage at V2 enables the output OUT_PAD to charge faster than it otherwise would without transistors N4 and N5, and capacitor C2.

Since P2 is turned on along with P1, the rise of voltage at node Pmid is well controlled (slowed down) and the $V_{DS}$ of P2 remains within the range of device tolerance limit Vmax, thus preventing the dynamic VDS overvoltage stress to P2. This substantially simultaneous turning on of P1 and P2 ensures a direct path from IO supply ($V_{CCIO}=2\times V_{DD}$) to output OUT_PAD.

The rising voltage at Pmid turns transistor N4 on. When transistor N4 turns on, V2 transitions from a high impedance node into a low impedance node, and the voltage $V_{DD}$ is passed to the gate of P2. This prevents gate oxide overstress to P2. The various junction voltages with respect to node V2 dip for a short duration, but the voltage dips are limited to $V_{DD}$.

At the same time the pre-driver circuit is switching IN_PU from high ($2\times V_{DD}$) to low ($V_{DD}$), the pre-driver circuit is switching node 110 (IN_PD) from high ($V_{DD}$) to low (0V). Transistor P4 is on. Transistor P4 couples the gate of N2 (V1) to second supply node 104 ($V_{DD}$). The gate of P5 is coupled with input node 110 and the falling voltage of IN_PD turns P5 on. The low impedance path to $V_{DD}$ through transistor P4 reduces the coupling through capacitor C1 to signal IN_PD at input node 110 and charge flows back to second supply node 104 ($V_{DD}$) through P5.

Static Output of a Logic High

When input node 110 (IN_PD) is driven low (0V) by the pre-driver circuit and N1 is off, output voltage OUT_PAD is at logic high ($2\times V_{DD}$). In addition, when IN_PD is low, transistor P5 is on. The gate of transistor N2 (V1) is thus a low impedance node connected to $V_{DD}$. The coupling of V1 to second supply node 104 ($V_{DD}$) prevents static gate oxide over voltage stress to N2. Further, the gate of feedback transistor N3 is coupled with the output node 112. When output node 112 (OUT_PAD) is at a logic high, feedback transistor N3, which is connected between $V_{DD}$ and common node Nmid, is on with its gate at $2\times V_{DD}$. This maintains the voltage at common node Nmid at $V_{DD}$ and thus avoids the static over-voltage stress to transistor N2, e.g., $V_{DS}$ of N2 stays within the device junction voltage limit Vmax. Transistor P4, which is connected between $V_{DD}$ and node V1, is off.

Transitioning Output to a Logic Low

In a transition of the output to a logic low, IN_PD is changed from logic low (0V) to a logic high ($V_{DD}$) by a pre-driver circuit. at input node 108. The pre-driver circuit level provides the input signal (IN_PD) at input node 110. The signal IN_PD at input node 110 drives the gate of transistor N1, turning N1 on.

At the start of the transition, transistor P4 is off. The rising voltage at node 110 (gate of P5) turns off transistor P5. With P4 and P5 off, the gate of N2 (V1) is isolated from the second supply node 104 ($V_{DD}$), which make V1 a high impedance node. Several aspects should be noted. First, the rising voltage at the gate of transistor N1 couples well through capacitor C1 to the high impedance node V1. Second, turning off P5 causes the gate voltage for N2 (V1) to dip for a short duration, together with the coupling through capacitor C1, causes a short duration boost to the gate voltage for N2 (node V1), and provides the required $V_{GS}$ to transistor N2, enabling N2 to turn on at the same time that transistor N1 is turned on. Third, the short duration boost in voltage at V1 enables the output OUT_PAD to discharge faster than it otherwise would without transistors P4 and P5, and capacitor C1.

Since N2 is turned on along with N1, the fall in voltage at node Nmid is well controlled (slowed down) and $V_{DS}$ of N2 remains within the range of device tolerance limit Vmax, thus preventing the dynamic $V_{DS}$ overvoltage stress to N2. This substantially simultaneous turning on of N1 and N2 ensures a direct path from output OUT_PAD to ground ($V_{SSP}$).

The falling voltage at Nmid turns transistor P4 on. When transistor P4 turns on, V1 transitions from a high impedance node into a low impedance node, and the voltage $V_{DD}$ is passed to the gate of N2. This prevents the gate oxide overstress to N2. The voltage at node V1 is momentarily boosted but the various junction voltages with respect to node V1 are within the range of $V_{DD}$.

At the same time the pre-driver circuit is switching IN_PD from logic low (0) to logic high ($V_{DD}$), the pre-driver circuit is switching node IN_PU is switching from logic low ($V_{DD}$) to logic high ($2\times V_{DD}$). Transistor N4 is on. Transistor N4 couples the gate of transistor P2 (V2) to the second supply node 104 ($V_{DD}$). The gate of N5 is coupled with input node 108 and the rising voltage of IN_PD turns N5 on. The low impedance path to $V_{DD}$ through transistor N4 reduces the coupling through capacitor C2 to signal IN_PU at input node 108 and charge flows back to second supply node 104 ($V_{DD}$) through N5.

Static Output of a Logic Low

When input node 108 (IN_PU) is driven high ($2\times V_{DD}$) by the pre-driver circuit and P1 is off, output voltage OUT_PAD is at logic low (0V). In addition, transistor N5 is on. The gate of transistor P2 (V2) is thus a low impedance node connected to $V_{DD}$. The coupling of V2 to second supply node 104 ($V_{DD}$) prevents static gate oxide over voltage stress to P2. Further, the gate of feedback transistor P3 is coupled with the output node 112. When output node 112 (OUT_PAD) is at a logic low (0V), feedback transistor P3, which is connected between $V_{DD}$ and common node Pmid, is on with its gate at 0V. This maintains the voltage at common node Pmid at $V_{DD}$ and thus avoids the static $V_{DS}$ over voltage stress to P2, e.g., $V_{DS}$ of P2 stays within the device junction voltage limit Vmax. Transistor N4, which is connected between $V_{DD}$ and node V2, is off.

Figure 4:
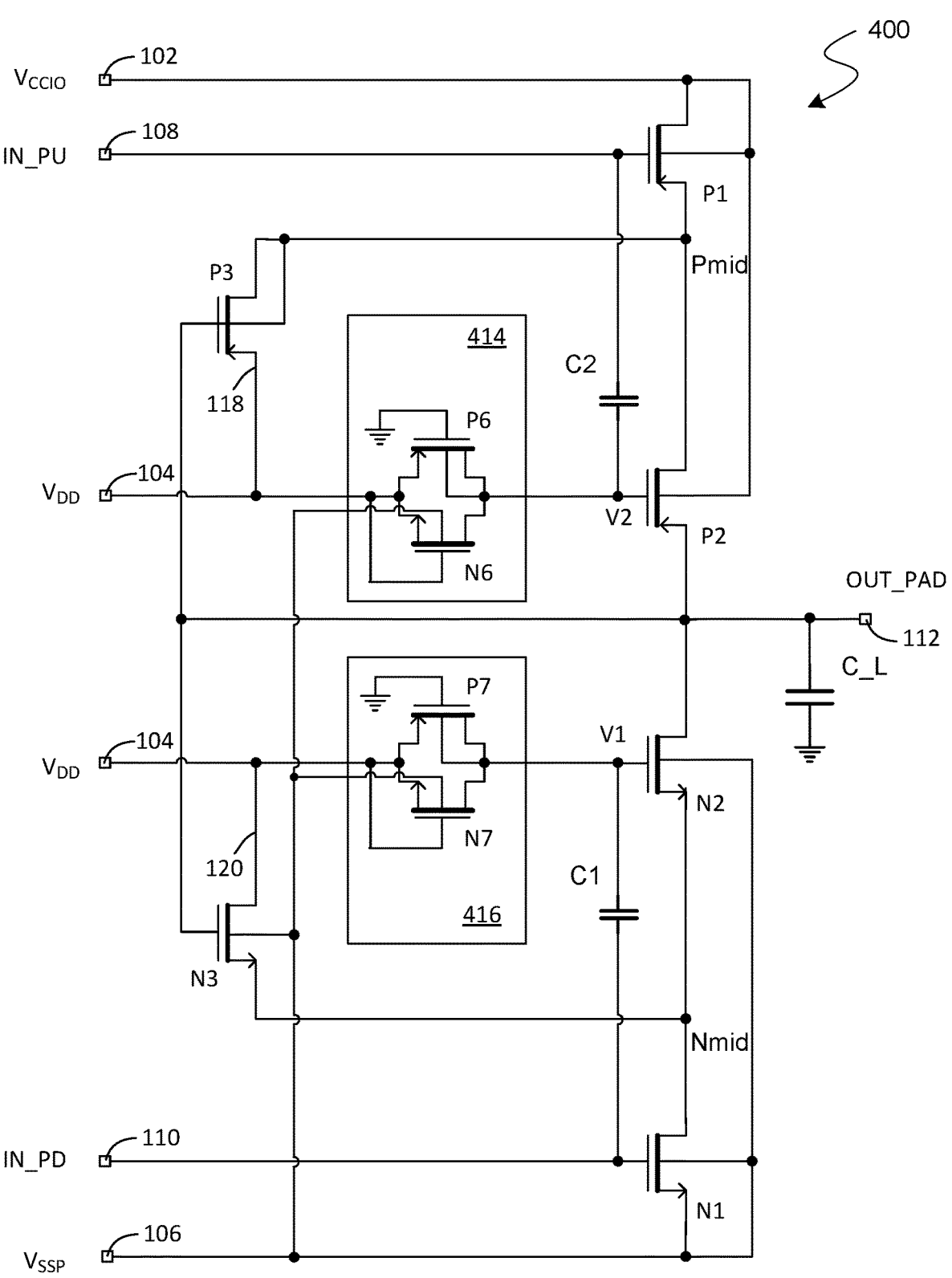
FIG. 4 is a schematic diagram of a dual-stacked high voltage driver circuit comprising over-voltage protection circuitry according to various embodiments.

FIG. 4 is a schematic diagram of a dual-stacked high voltage driver circuit 400 comprising various over-voltage protection circuitry in accordance with some embodiments. The example of FIG. 4 is a 3.3V IO buffer using 1.8V devices. Circuit 400 provides high voltage (3.3V) signaling using low voltage (1.8V) devices. Voltage driver circuit 400 comprises the first supply node 102, second supply node 104, third node 106, first input node 108, second input node 110, and output node 112, which may be the same as the example circuit 100 of FIG. 1. Voltage driver circuit 400 comprises the first stack transistors (P1 and P2) and the second stack of transistors (N1 and N2), which may be the same as and connected in the same way as the example circuit 100 of FIG. 1. Voltage driver circuit 400 comprises the feedback transistors P3 and N3, and capacitors C1 and C2, which may be the same as and connected in the same way as the example circuit 100 of FIG. 1. Voltage driver circuit 300 also comprises circuitries 414 and 416, which are described below.

The impedance circuitry 414 is coupled to the gate terminal of P2 (V2) and the second supply node 104. In an embodiment, the impedance circuitry 414 comprises a first pass-gate circuit, also referred to as transmission gate circuit. The first pass-gate circuit comprises a transistor P6 of P conductivity type, and a transistor N6 of N conductivity type. The transistor P6 is coupled to the gate terminal of P2 (V2) and the second supply node 104. The gate terminal of P6 may be coupled to a ground node or to another node providing a signal to turn transistor P6 on. The transistor N6 is coupled to the gate terminal of P2 (V2) and the second supply node 104. The gate terminal of N6 may be coupled to the second supply node 104 or to another supply voltage providing a signal to turn transistor N6 on.

The impedance circuitry 416 is coupled to the gate terminal of N2(V1) and the second supply node 104. In an embodiment, the impedance circuitry 416 comprises a second pass-gate circuit. The second pass-gate circuit comprises a transistor P7 of P conductivity type, and a transistor N7 of N conductivity type. The transistor P7 is coupled to the gate terminal of N2 (V1) and the second supply node 104. The gate terminal of P7 may be coupled to a ground node or to another node providing a signal to turn transistor P7 on. The transistor N7 is coupled to the gate terminal of N2 (V1) and the second supply node 104. The gate terminal of N7 may be coupled to the second supply node 104 or to another supply voltage providing a signal to turn transistor N7 on.

The circuitries 414 and 416 provide a fixed resistance between the gate terminal of P2 (V2) and the second supply node 104 ($V_{DD}$). In an alternative embodiment, impedance circuitry 414 comprises a first resistor and impedance circuitry 416 comprises a second resistor.

In the example voltage driver circuit 400, a source/drain terminal 118 of the first feedback transistor P3 is coupled to the second supply node 104. As such, the impedance circuitry 414 separates the terminal 118 from the gate terminal of P2 (V2). In addition, a source/drain terminal 120 of second feedback transistor N3 is coupled to the second supply node 104. The impedance circuitry 416 separates the terminal 120 from the gate terminal of N2 (V1). The source/drain terminal connections 118 and 120 of the feedback transistors may be contrasted with source/drain terminal connections feedback transistors of an existing voltage driver circuit. A first feedback transistor of an existing voltage driver circuit is coupled to the common node Pmid and to the gate terminal of cascode transistor P2 (V2). A gate terminal of the first feedback transistor of an existing voltage driver is coupled to the output node 112. A second feedback transistor of the existing voltage driver circuit is coupled to the common node Nmid and to the gate terminal of cascode transistor N2 (V1). A gate terminal of second feedback transistor the existing voltage driver circuit is coupled to the output node 112.

Accordingly, in the existing voltage driver circuit, the terminals 118 and 120 of the first and second feedback transistors P3 and N3 are directly connected with the gates of transistors P2 and N2. In the existing voltage driver circuit, the terminals 118 and 120 of the first and second feedback transistors P3 and N3 are not separated from respective gates V2 and V1 of the cascode transistors P2 and N2 by a pass-gate or by a resistor. In contrast, in various embodiments, terminal 118 of feedback transistor P3 is separated from the gate terminal of P2 (V2) with circuitry, e.g., circuitries 114, 314, and 414, which prevents or limits transistor P3 from draining charge at node V2 when P3 is on. Similarly, in various embodiments, the terminal 120 of feedback transistor N3 is separated from the gate terminal of N2 (V1) with circuitries 116, 316, and 416, which prevents or limits transistor N3 from draining charge at node V1 when N3 is on. Preventing or limiting the first and second feedback transistors P3 and N3 from draining charge from nodes V1 and V2 improves coupling, in comparison to the existing voltage driver circuit, between transistors N2 and N1, and between transistors P2 and P1.

Figure 5:
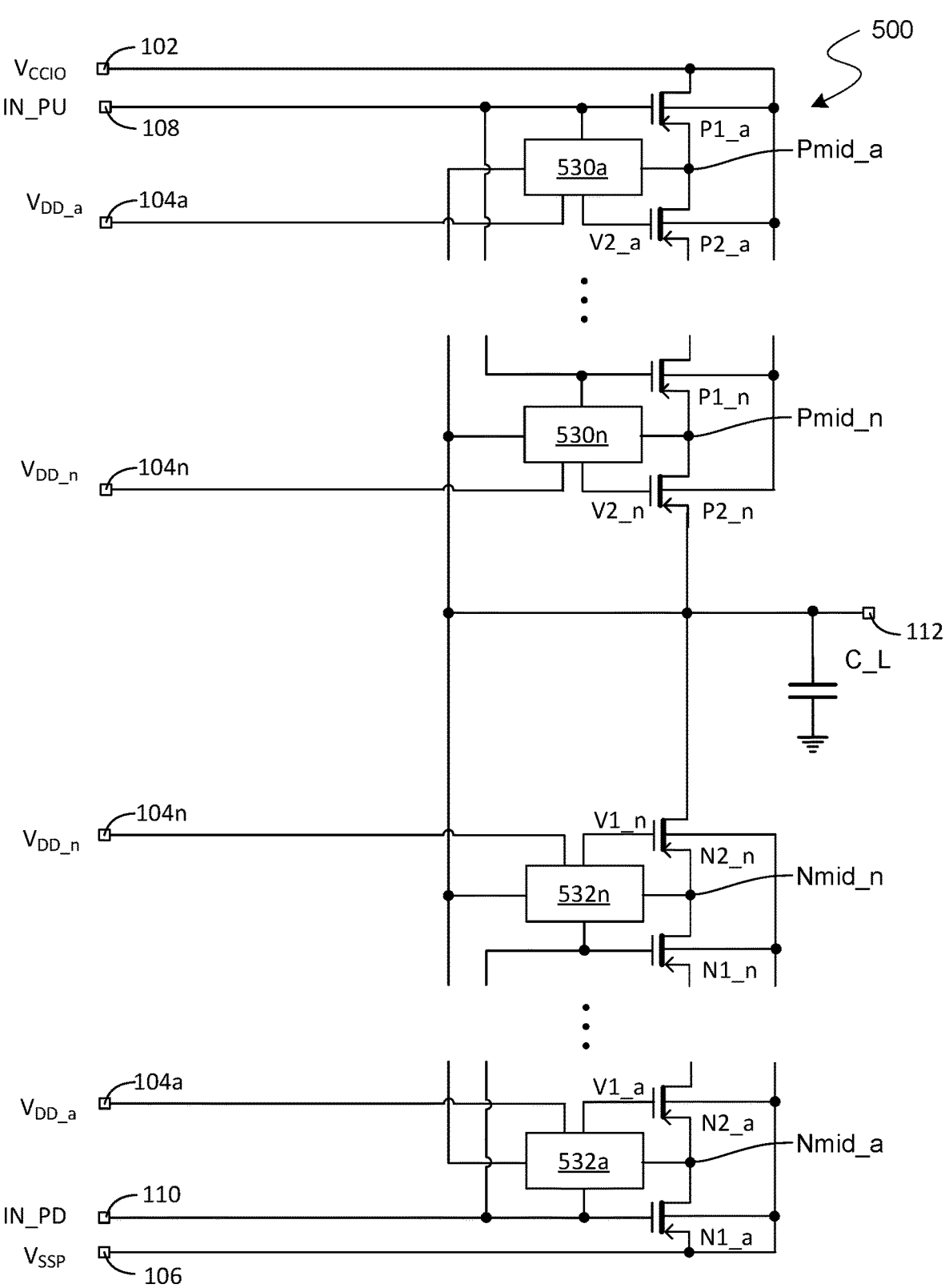
FIG. 5 is a schematic diagram of an N-stacked high voltage driver circuit comprising over-voltage protection circuitry according to various embodiments.

FIG. 5 is a schematic diagram of an N-stacked high voltage driver circuit 500 comprising over-voltage protection circuitry according to various embodiments. Voltage driver circuit 500 comprises the first supply node 102, third node 106, first input node 108, second input node 110, and output node 112, which may be the same as the example circuit 100 of FIG. 1. Voltage driver circuit 500 comprises multiple instances of second supply node, e.g., second supply node 104a, . . . second supply node second supply node 104n. The second supply nodes each supply a second voltage, e.g., $V_{DD\_a}$, . . . $V_{DD\_n}$. The second voltages $V_{DD}$ are lower than the first voltage $V_{CCIO}$. The second voltages $V_{DD}$ are also higher than the third voltage $V_{SSP}$.

The voltage driver circuit 500 comprises two or more first stacks of P-conductivity type transistors, wherein each of the two or more first stacks comprises a first transistor and a second transistor, e.g., P1_a and P2_a, . . . P1_n and P2_n. The number of first stacks is an integer greater than or equal to 2. The voltage driver circuit 500 includes a common node Pmid for each of the two or more first stacks, e.g., Pmid_a, . . . Pmid_n. Each of the two or more first stacks is coupled with a first circuitry unit, e.g., first circuitry unit 530a, . . . first circuitry unit 530n. Each first circuitry unit 530 can be the same as or similar to the first circuitry unit 130 depicted in FIG. 1, e.g., each first circuitry unit 530 can include a feedback transistor, a capacitor, and impedance circuitry 114. The impedance circuitry 114 in first circuitry unit 530 may be the same as or similar to impedance circuitry 314 or impedance circuitry 414, respectively depicted in FIG. 3 and FIG. 4.

The voltage driver circuit 500 comprises two or more second stacks of N-conductivity type transistors, wherein each of the two or more second stacks comprises a third transistor and a fourth transistor, e.g., N1_a and N2_a, . . . N1_n and N2_n. The number of second stacks is an integer greater than or equal to 2. The voltage driver circuit 500 includes a common node Nmid for each of the two or more second stacks, e.g., Nmid_a, . . . Nmid_n. Each of the two or more second stacks is coupled with a second circuitry unit, e.g., second circuitry unit 532a, . . . second circuitry unit 532n. Each second circuitry unit 532 can be the same as or similar to the second circuitry unit 132 depicted in FIG. 1, e.g., each second circuitry unit 532 can include a feedback transistor, a capacitor, and impedance circuitry 116. The impedance circuitry 116 in second circuitry unit 532 may be the same as or similar to impedance circuitry 316 or impedance circuitry 416, respectively depicted in FIG. 3 and FIG. 4.

Figure 6:
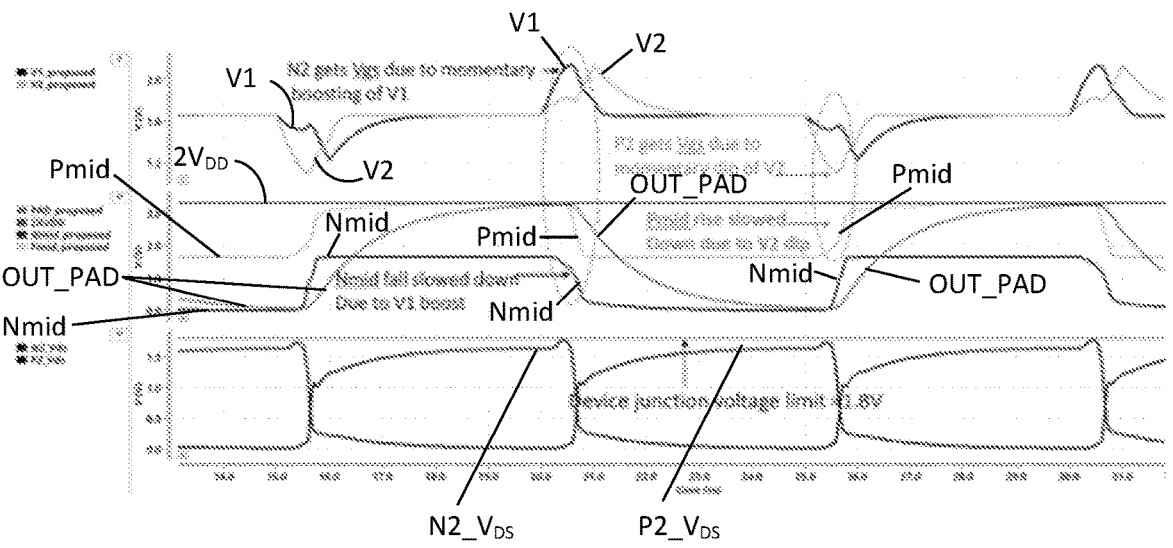
FIG. 6 illustrates simulation results for the dual-stacked high voltage driver circuit comprising over-voltage protection circuitry shown in FIG. 3.

FIG. 6 illustrates simulation results for circuit 300 shown in FIG. 3. FIG. 6 illustrates the benefits of feedback transistors P3 and N3, capacitors C1 and C2, and impedance circuitry 314 and 316. Three sets of waveforms are shown using three y-axes (voltage) and a common x-axis (time). The top set of waveforms are voltages for nodes V1 and V2. The middle set of waveforms are for common nodes Nmid and Pmid, and output OUT_PAD. The bottom set of waveforms show drain-source voltage $V_{DS}$ for cascode transistors N2 and P2.

It can be seen that between about the 20 ns and 21 ns that the voltage at node V1 increases significantly for a short time. The voltage boost occurs as OUT_PAD signal transitions from logic high ($2 \times V_{DD}$) to logic low. The short duration voltage boost at V1 is due to coupling capacitor C1 and high node-impedance provided by transistor P5 in an off state. The fall in voltage at Nmid is slowed down as a result of the voltage boost at node V1. Advantageously, the drain-source voltage $V_{DS}$ of N2 stays below Vmax of 1.8 volts. In the opposite output transition (low to high), negative coupling is significantly less due to transistor P4 being in an on state.

It can be seen that between about the 25 ns and 26 ns that the voltage at node V2 decreases significantly for a short time. The voltage dip occurs as the node V2 when the OUT_PAD signal transitions from logic low to logic high ($2 \times V_{DD}$). The short duration voltage dip at V2 is due to coupling capacitor C2 and high node-impedance due to transistor N5 being in an off state. Advantageously, the drain-source voltage $V_{DS}$ of P2 stays below Vmax of 1.8 volts. In the opposite output transition (high to low), negative coupling is significantly less due to transistor N4 being in an on state.

Figure 7:
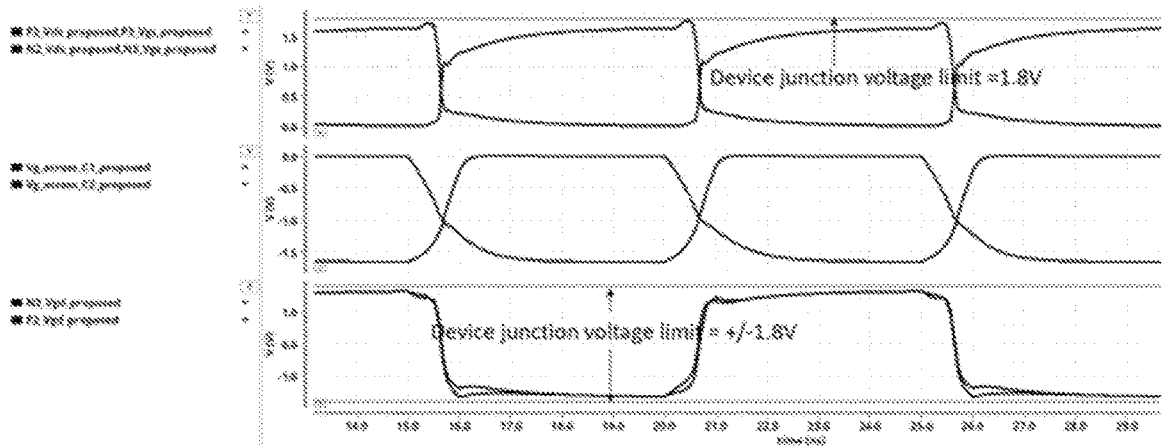
FIG. 7 illustrates simulation results for the dual-stacked high voltage driver circuit comprising over-voltage protection circuitry shown in FIG. 3.

FIG. 7 illustrates simulation results for circuit 300 shown in FIG. 3. FIG. 7 illustrates the benefits of feedback transistors P3 and N3, capacitors C1 and C2, and impedance circuitry 314 and 316. Three sets of waveforms are shown using three y-axes (voltage) and a common x-axis (time). The top set of waveforms are drain-source voltages $V_{DS}$ for P2 and N2 and gate-source voltages $V_{GS}$ for P3 and N3 over several cycles. The middle set of waveforms are for voltages across capacitors C1 and C2 over several cycles. The bottom set of waveforms show gate-drain voltages $V_{GD}$ for cascode transistors N2 and P2 over several cycles. It can be seen that the various junction voltages involving nodes V1 and V2 are limited to the device limit Vmax of 1.8V.

FIGS. 8, 9, 10, and 11 illustrate comparative performance data for voltage driver circuit 300, voltage driver circuit 400 and an existing stacked driver circuit(circuit_premod). It should be noted that the driver size, coupling capacitor size, speed, loading, and other simulation conditions have been kept the same for voltage driver circuit 300, voltage driver circuit 400, and an existing stacked driver circuit(circuit_premod) for the examples in FIGS. 8, 9, 10, and 11.

Figure 8:
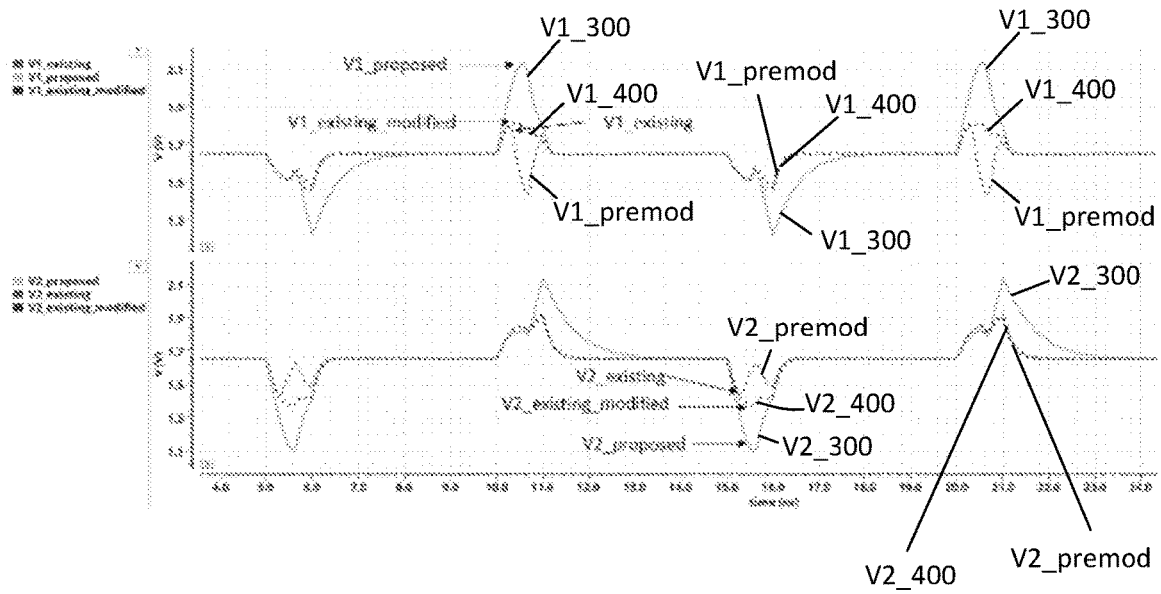
FIG. 8 illustrates simulation results comparing for voltage driver circuit shown in FIG. 3, the voltage driver circuit shown in FIG. 4, and an existing voltage driver circuit.

FIG. 8 illustrates simulation results for voltage driver circuit 300, voltage driver circuit 400, and an existing voltage driver circuit. Two sets of waveforms are shown using two y-axes (voltage) and a common x-axis (time). The top set of waveforms are voltages for node V1 (gate of N-type cascode transistor) and the bottom set of waveforms are voltages for node V2 (gate of P-type cascode transistor). Voltages for voltage driver circuit 300, shown in FIG. 3, are V1_300 and V2_300. Voltages for voltage driver circuit 400, shown in FIG. 4, are V1_400 and V2_400. The voltages V1_premod and V2_premod are for an existing circuit similar to voltage driver circuit 400, but with one source/ drain terminal of feedback transistor N3 connected to V1 instead of $V_{DD}$, and one terminal of feedback transistor P3 connected to V2 instead of $V_{DD}$.

As described herein, embodiments provide a short duration voltage boost or dip at nodes V1 and V2. Referring to FIG. 8, in the period between about time 10 ns and 11 ns, the voltage at node V1 dips in the existing voltage driver circuit, as shown by waveform V1_premod. In contrast, during the same time period, voltage driver circuit 400 eliminates this dip and provides a moderate boost in voltage at node V1, as shown by waveform V1_400. An even greater voltage boost at node V1 is provided in this time period by voltage driver circuit 300, as shown by waveform V1_300. In the period between about time 15 ns and 16 ns, the existing voltage driver circuit provides a small boost in the voltage at node V2, as shown by waveform V2_premod. In contrast, during the same time period, voltage driver circuit 400 provides a moderate short dip in voltage at node V2, as shown by waveform V2_400. An even greater voltage dip at node V2 is provided in this time period by voltage driver circuit 300, as shown by waveform V2_300.

The momentary boosting/dipping is exactly timed with driver device switching and provides required enhancement of $V_{GS}$ only when needed to avoid any excessive drain-source voltage to the devices connected to OUT_PAD (N2 and P2). This mechanism ensures that devices N2 and P2 will not suffer from hot carrier degradation. All additional devices (N3, N4, N5, P3, P4 and P5) are used to define the nodes in static condition and are not in the data path.

Figure 9:
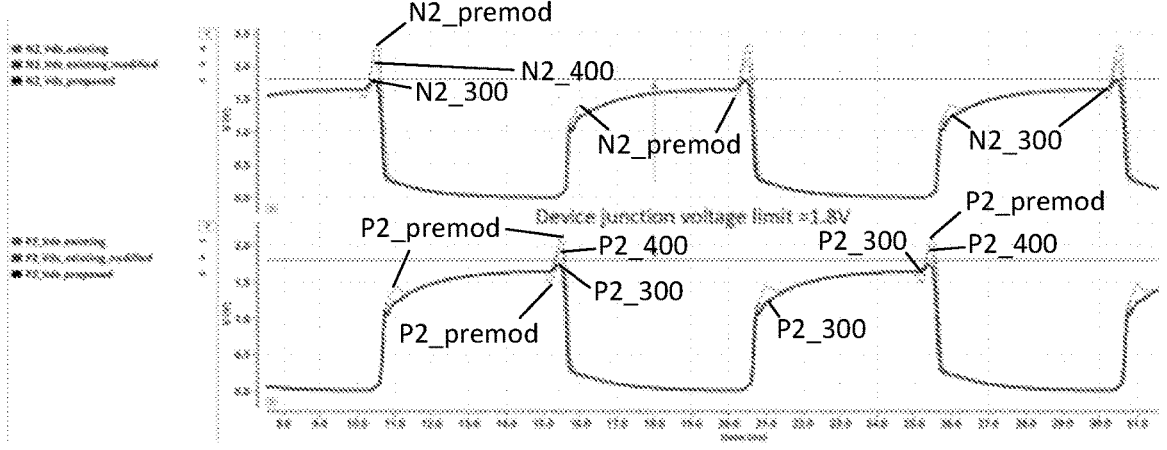
FIG. 9 illustrates simulation results comparing for voltage driver circuit shown in FIG. 3, the voltage driver circuit shown in FIG. 4, and an existing voltage driver circuit.

FIG. 9 illustrates simulation results for voltage driver circuit 300, voltage driver circuit 400, and an existing voltage driver circuit. Two sets of waveforms are shown using two y-axes (voltage) and a common x-axis (time). The top set of waveforms are drain-source voltages $V_{DS}$ for cascode transistor N2 and the bottom set of waveforms are drain-source voltages $V_{DS}$ for cascode transistor P2. Voltages for voltage driver circuit 300, shown in FIG. 3, are N2_300 and P2_300. Voltages for voltage driver circuit 400, shown in FIG. 4, are N2_400 and P2_400. The voltages N2_premod and P2_premod are for an existing circuit similar to voltage driver circuit 400, but with one source/ drain terminal of feedback transistor N3 connected to V1 instead of $V_{DD}$, and one terminal of feedback transistor P3 connected to V2 instead of $V_{DD}$.

Referring to FIG. 9, at about time 10.5 ns, it can be seen that $V_{DS}$ for N2_premod is about 2.3V, well above Vmax of 1.8V. At the same time, $V_{DS}$ for N2_400 is about 2.0V, still above Vmax, but lower than N2_premod. Still referring to the same time, $V_{DS}$ for N2_300 is about 1.75V, which is under Vmax. At about time 15.5 ns, it can be seen that $V_{DS}$ for P2_premod is about 2.2V, well above Vmax of 1.8V. At the same time, $V_{DS}$ for P2_400 is about 1.95V, still above Vmax, but lower than P2_premod. Still referring to the same time, $V_{DS}$ for P2_300 is about 1.75V, which is under Vmax.

Figure 10:
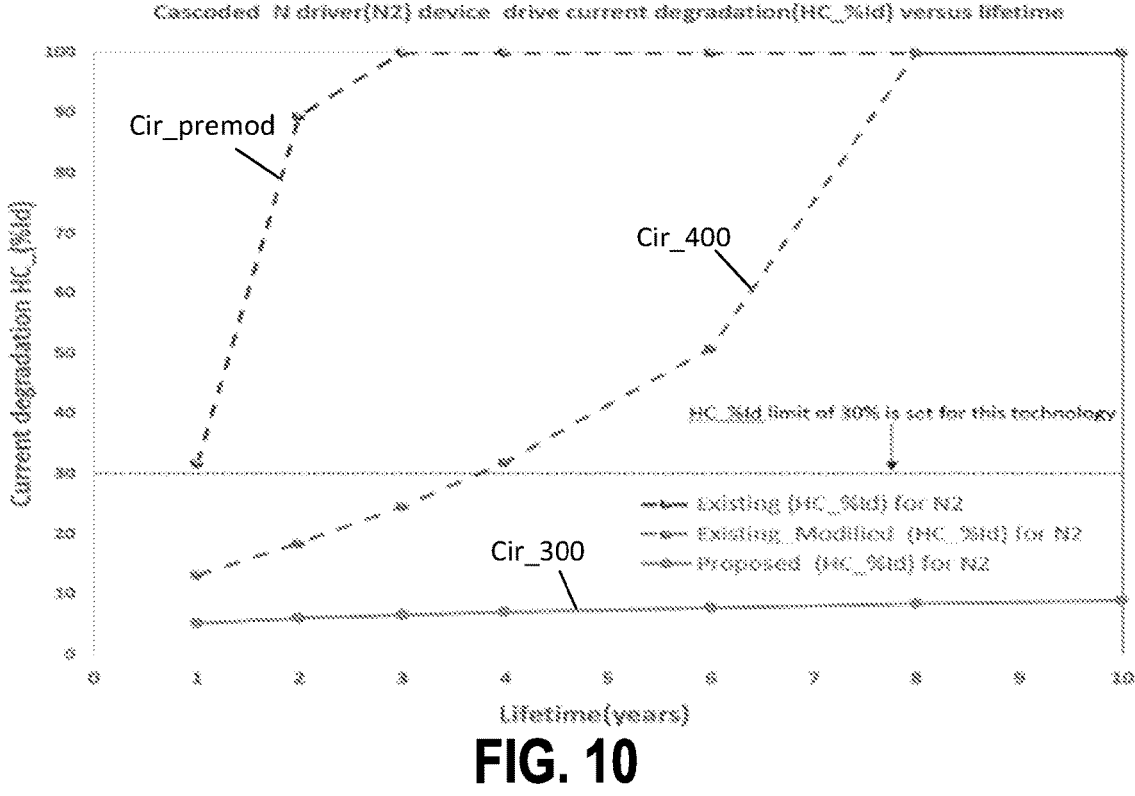
FIG. 10 is a graph comparing current degradation data for voltage driver circuit shown in FIG. 3, the voltage driver circuit shown in FIG. 4, and an existing voltage driver circuit over time.

FIG. 10 is a graph comparing current degradation data for voltage driver circuit 300 (Cir_300), voltage driver circuit 400 (Cir_400), and an existing voltage driver circuit (Cir_premod) over time. Current degradation (HC_% Id) may be caused by hot carrier injection. The existing circuit is similar to voltage driver circuit 400, but with one source/drain terminal of feedback transistor N3 connected to V1 instead of $V_{DD}$, and one terminal of feedback transistor P3 connected to V2 instead of $V_{DD}$. The maximum degradation for the technology is 30%. Current in the existing voltage driver circuit degrades by more than 30% after year 1, and by 100% after year three. In contrast, current in voltage driver circuit 400 degrades by more than 30% after about year 3.75, while current in voltage driver circuit 300 does not degrade by more than 30% over a 10-year period.

Figure 11:
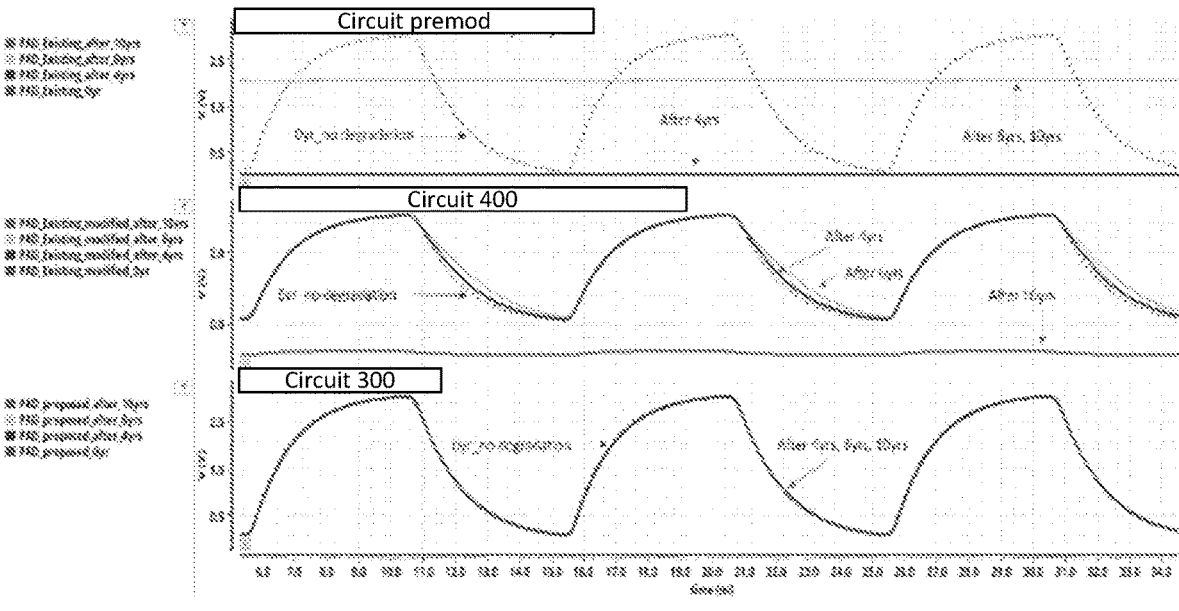
FIG. 11 illustrates transient performance of voltage driver circuit shown in FIG. 3, the voltage driver circuit shown in FIG. 4, and an existing voltage driver circuit at different points of device life.

FIG. 11 illustrates transient performance of voltage driver circuit 300 (Circuit 300), voltage driver circuit 400 (Circuit 400), and an existing voltage driver circuit (Circuit premod) at different points of device life. The existing circuit is similar to voltage driver circuit 400, but with one source/ drain terminal of feedback transistor N3 connected to V1 instead of $V_{DD}$, and one terminal of feedback transistor P3 connected to V2 instead of $V_{DD}$. Three sets of waveforms are shown using three y-axes (voltage) and a common x-axis (time). The top set of waveforms are for the existing voltage driver circuit. The middle set of waveforms are for voltage driver circuit 400. The bottom set of waveforms are for voltage driver circuit 300. Each set of waveforms includes four waveforms for output OUT_PAD at four points in time of device life: 0 years, 4 years, 6 years, and 10 years. For all of the circuits, output OUT_PAD at 0 years correctly switches between about 0V and about 3.3V. However, it can be seen that output OUT_PAD for the existing voltage driver circuit (top) stays at 0V after 4 years and at about 2.1V at the 6- and 10-year points. Voltage driver circuit 400 (middle) shows significantly better performance than the existing voltage driver circuit. Voltage driver circuit 400 shows some degradation during switching from high to low after 4 and 6 years, and only becomes non-functional at year 10. Voltage driver circuit 300 (bottom) shows good performance at all points in device life.

Table 1 provides a comparison between the voltage driver circuit 300 (Circuit 300), voltage driver circuit 400 (Circuit 400), and an existing voltage driver circuit (Circuit premod). The table compares sizes of coupling capacitors, e.g., C1, C2 and sizes of the pre-driver circuitry to achieve the required coupling and speed of operation. The existing circuit is similar to voltage driver circuit 400, but with one source/drain terminal of feedback transistor N3 connected to V1 instead of $V_{DD}$, and one terminal of feedback transistor P3 connected to V2 instead of $V_{DD}$.

TABLE 1

| Parameter | Circuit premod | Circuit 400 | Circuit 300 |
|---|---|---|---|
| Coupling Capacitor | 10X | 5X | 1X |
| Pre-driver size | 3.75X | 1.75X | 1X |

Table 1 illustrates that the coupling capacitors, e.g., C1 and C2, of voltage driver circuit 400 can be one-half the size of comparable devices in the existing voltage driver circuit. In addition, the coupling capacitors C1 and C2 of voltage driver circuit 300 can be 20% the size of the coupling capacitors C1 and C2 of voltage driver circuit 400. A pre-driver circuit provides the input signals IN_PU and IN_PD to input nodes 108 and 110 of each of the voltage drive circuits shown in Table 1. The pre-driver circuit level translates the input signal from 2×VDD to VDD (IN_PU) at input node 108, and drives input node 110 (IN_PD) to (0V) on opposite logic swings. Table shows that size of the pre-driver circuit can be made significantly smaller in voltage driver circuits 400 and 300 as compared with the existing voltage driver circuit.

Transistors have internal capacitances. For example, the internal capacitances include capacitances between the gate and drain, and the gate and source. The magnitude of the internal capacitances depends on feature size, among other things. In an embodiment, a coupling capacitor, e.g., C2, comprises features of a first size, and the second transistor P2 comprises features of a second size. The first size of the features of C2 is proportional to the second size of the features of P2. In another embodiment, a coupling capacitor, e.g., C1, comprises features of a first size, and the second transistor N2 comprises features of a second size. The first size of the features of C1 is proportional to the second size of the features of N2.

As can be seen from Table 1, the existing dual-stacked high voltage driver (Circuit premod), which includes over-protection circuitry has several disadvantages. First, it may not prevent dynamic over-voltage stress to the PMOS devices in the transmission gates, which leads to gate oxide overstress. Another disadvantage of the existing circuit is that requires a larger value of capacitor than the voltage driver circuit 300 (Circuit 300), voltage driver circuit 400 (Circuit 400) as it needs to couple to a low impedance node (due to the always on device connected to it). The low impedance node is also connected to a fully on device (N3/P3) which drains the coupled voltage making the coupling less effective. The larger capacitor needed for better coupling further loads the pre-driver circuitry that provides input signals.

Figure 12:
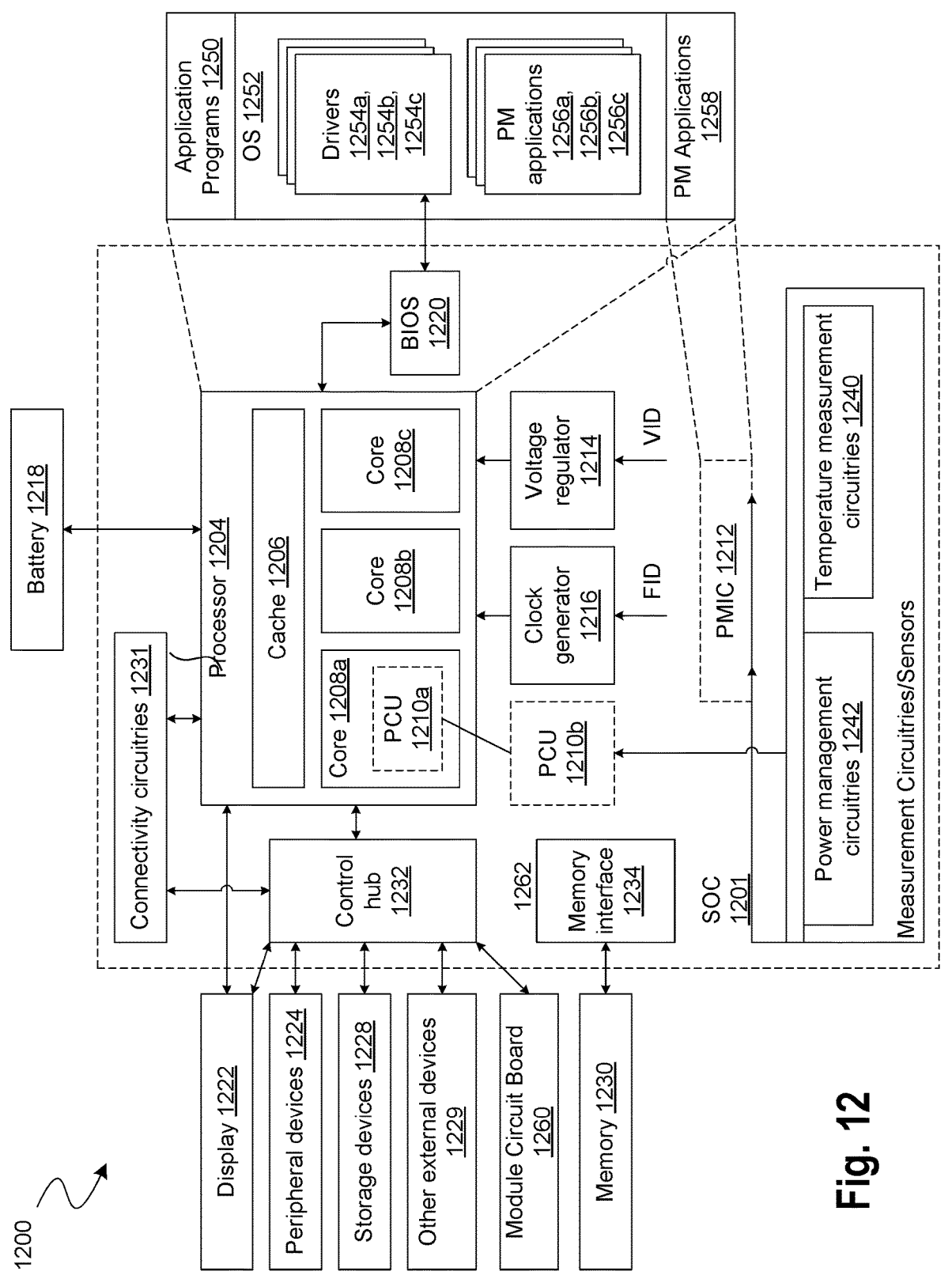
FIG. 12 illustrates a computer system or computing device that includes over-voltage protection circuitry in accordance with some embodiments.

FIG. 12 illustrates a smart device, or a computer system, or a SoC (System-on-Chip) with apparatus for fast startup of a crystal, according to some embodiments of the disclosure. In some embodiments, device 1200 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 1200. Any components here can have apparatus for fast startup of a crystal of various embodiments.

In an example, the device 1200 comprises a SoC (System-on-Chip) 1201. An example boundary of the SOC 1201 is illustrated using dotted lines in FIG. 12, with some example components being illustrated to be included within SOC 1201—however, SOC 1201 may include any appropriate components of device 1200.

In some embodiments, device 1200 includes processor 1204. Processor 1204 can include one or more physical devices, such as microprocessors, application processors, microcontrollers, programmable logic devices, processing cores, or other processing means. The processing operations performed by processor 1204 include the execution of an operating platform or operating system on which applications and/or device functions are executed. The processing operations include operations related to I/O (input/output) with a human user or with other devices, operations related to power management, operations related to connecting computing device 1200 to another device, and/or the like. The processing operations may also include operations related to audio I/O and/or display I/O.

In some embodiments, processor 1204 includes multiple processing cores (also referred to as cores) 1208a, 1208b, 1208c. Although merely three cores 1208a, 1208b, 1208c are illustrated, processor 1204 may include any other appropriate number of processing cores, e.g., tens, or even hundreds of processing cores. Processor cores 1208a, 1208b, 1208c may be implemented on a single integrated circuit (IC) chip. Moreover, the chip may include one or more shared and/or private caches, buses or interconnections, graphics and/or memory controllers, or other components.

In some embodiments, processor 1204 includes cache 1206. In an example, sections of cache 1206 may be dedicated to individual cores 1208 (e.g., a first section of cache 1206 dedicated to core 1208a, a second section of cache 1206 dedicated to core 1208b, and so on). In an example, one or more sections of cache 1206 are shared among two or more of cores 1208. Cache 1206 may be split in different levels, e.g., level 1 (L1) cache, level 2 (L2) cache, level 3 (L3) cache, etc.

In some embodiments, processor core 1204 may include a fetch unit to fetch instructions (including instructions with conditional branches) for execution by the core 1204. The instructions are fetched from any storage devices such as the memory 1230. Processor core 1204 may also include a decode unit to decode the fetched instruction. For example, the decode unit may decode the fetched instruction into a plurality of micro-operations. Processor core 1204 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 1204 may be an out-of-order processor core in one embodiment. Processor core 1204 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 1204 may also include a bus unit to enable communication between components of the processor core 1204 and other components via one or more buses. Processor core 1204 may also include one or more registers to store data accessed by various components of the core 1204 (such as values related to assigned app priorities and/or sub-system states (modes) association.

In some embodiments, device 1200 comprises connectivity circuitries 1231. For example, connectivity circuitries 1231 includes hardware devices (e.g., wireless and/or wired connectors and communication hardware) and/or software components (e.g., drivers, protocol stacks), e.g., to enable device 1200 to communicate with external devices. Device 1200 may be separate from the external devices, such as other computing devices, wireless access points or base stations, etc.

In an example, connectivity circuitries 1231 may include multiple different types of connectivity. To generalize, the connectivity circuitries 1231 may include cellular connectivity circuitries, wireless connectivity circuitries, etc. Cellular connectivity circuitries of connectivity circuitries 1231 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 1231 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 1231 may include a network interface, such as a wired or wireless interface, e.g., so that a system embodiment may be incorporated into a wireless device, for example, cell phone or personal digital assistant.

In some embodiments, device 1200 comprises control hub 1232, which represents hardware devices and/or software components related to interaction with one or more I/O devices. For example, processor 1204 may communicate with one or more of display 1222, one or more peripheral devices 1224, storage devices 1228, one or more other external devices 1229, etc., via control hub 1232. Control hub 1232 may be a chipset, a Platform Control Hub (PCH), and/or the like.

For example, control hub 1232 illustrates one or more connection points for additional devices that connect to device 1200, e.g., through which a user might interact with the system. For example, devices (e.g., devices 1229) that can be attached to device 1200 include microphone devices, speaker or stereo systems, audio devices, video systems or other display devices, keyboard or keypad devices, or other I/O devices for use with specific applications such as card readers or other devices.

As mentioned above, control hub 1232 can interact with audio devices, display 1222, etc. For example, input through a microphone or other audio device can provide input or commands for one or more applications or functions of device 1200. Additionally, audio output can be provided instead of, or in addition to display output. In another example, if display 1222 includes a touch screen, display 1222 also acts as an input device, which can be at least partially managed by control hub 1232. There can also be additional buttons or switches on computing device 1200 to provide I/O functions managed by control hub 1232. In one embodiment, control hub 1232 manages devices such as accelerometers, cameras, light sensors or other environmental sensors, or other hardware that can be included in device 1200. The input can be part of direct user interaction, as well as providing environmental input to the system to influence its operations (such as filtering for noise, adjusting displays for brightness detection, applying a flash for a camera, or other features).

In some embodiments, control hub 1232 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 1222 represents hardware (e.g., display devices) and software (e.g., drivers) components that provide a visual and/or tactile display for a user to interact with device 1200. Display 1222 may include a display interface, a display screen, and/or hardware device used to provide a display to a user. In some embodiments, display 1222 includes a touch screen (or touch pad) device that provides both output and input to a user. In an example, display 1222 may communicate directly with the processor 1204. Display 1222 can be one or more of an internal display device, as in a mobile electronic device or a laptop device or an external display device attached via a display interface (e.g., DisplayPort, etc.). In one embodiment display 1222 can be a head mounted display (HMD) such as a stereoscopic display device for use in virtual reality (VR) applications or augmented reality (AR) applications.

In some embodiments and although not illustrated in the figure, in addition to (or instead of) processor 1204, device 1200 may include Graphics Processing Unit (GPU) comprising one or more graphics processing cores, which may control one or more aspects of displaying contents on display 1222.

Control hub 1232 (or platform controller hub) may include hardware interfaces and connectors, as well as software components (e.g., drivers, protocol stacks) to make peripheral connections, e.g., to peripheral devices 1224.

It will be understood that device 1200 could both be a peripheral device to other computing devices, as well as have peripheral devices connected to it. Device 1200 may have a "docking" connector to connect to other computing devices for purposes such as managing (e.g., downloading and/or uploading, changing, synchronizing) content on device 1200. Additionally, a docking connector can allow device 1200 to connect to certain peripherals that allow computing device 1200 to control content output, for example, to audiovisual or other systems.

In addition to a proprietary docking connector or other proprietary connection hardware, device 1200 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 1231 may be coupled to control hub 1232, e.g., in addition to, or instead of, being coupled directly to the processor 1204. In some embodiments, display 1222 may be coupled to control hub 1232, e.g., in addition to, or instead of, being coupled directly to processor 1204.

In some embodiments, device 1200 comprises memory 1230 coupled to processor 1204 via memory interface 1234. Memory 1230 includes memory devices for storing information in device 1200. Memory can include nonvolatile (state does not change if power to the memory device is interrupted) and/or volatile (state is indeterminate if power to the memory device is interrupted) memory devices. Memory device 1230 can be a dynamic random access memory (DRAM) device, a static random access memory (SRAM) device, flash memory device, phase-change memory device, or some other memory device having suitable performance to serve as process memory. In one embodiment, memory 1230 can operate as system memory for device 1200, to store data and instructions for use when the one or more processors 1204 executes an application or process. Memory 1230 can store application data, user data, music, photos, documents, or other data, as well as system data (whether long-term or temporary) related to the execution of the applications and functions of device 1200.

Elements of various embodiments and examples are also provided as a machine-readable medium (e.g., memory 1230) for storing the computer-executable instructions (e.g., instructions to implement any other processes discussed herein). The machine-readable medium (e.g., memory 1230) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 1200 comprises temperature measurement circuitries 1240, e.g., for measuring temperature of various components of device 1200. In an example, temperature measurement circuitries 1240 may be embedded, or coupled or attached to various components, whose temperature are to be measured and monitored. For example, temperature measurement circuitries 1240 may measure temperature of (or within) one or more of cores 1208*a*, 1208*b*, 1208*c*, voltage regulator 1214, memory 1230, a mother-board of SOC 1201, and/or any appropriate component of device 1200.

In some embodiments, device 1200 comprises power measurement circuitries 1240 e.g., for measuring power consumed by one or more components of the device 1200. In an example, in addition to, or instead of, measuring power, the power measurement circuitries 1240 may measure voltage and/or current. In an example, the power measurement circuitries 1240 may be embedded, or coupled or attached to various components, whose power, voltage, and/or current consumption are to be measured and monitored. For example, power measurement circuitries 1240 may measure power, current and/or voltage supplied by one or more voltage regulators 1214, power supplied to SOC 1201, power supplied to device 1200, power consumed by processor 1204 (or any other component) of device 1200, etc.

In some embodiments, device 1200 comprises one or more voltage regulator circuitries, generally referred to as voltage regulator (VR) 1214 VR having a high bandwidth and low power differential-to-single-ended type-III compensator. VR 1214 generates signals at appropriate voltage levels, which may be supplied to operate any appropriate components of the device 1200. Merely as an example, VR 1214 is illustrated to be supplying signals to processor 1204 of device 1200. In some embodiments, VR 1214 receives one or more Voltage Identification (VID) signals, and generates the voltage signal at an appropriate level, based on the VID signals. Various type of VRs may be utilized for the VR 1214. For example, VR 1214 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 1210*a/b* and/or PMIC 1212. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 1200 comprises one or more clock generator circuitries, generally referred to as clock generator 1216. Clock generator 1216 generates clock signals at appropriate frequency levels, which may be supplied to any appropriate components of device 1200. Merely as an example, clock generator 1216 is illustrated to be supplying clock signals to processor 1204 of device 1200. In some embodiments, clock generator 1216 receives one or more Frequency Identification (FID) signals, and generates the clock signals at an appropriate frequency, based on the FID signals. Clock generator 1216 is an adaptive clock source that can provide an adaptive frequency output as discussed with reference to various embodiments.

In some embodiments, device 1200 comprises battery 1218 supplying power to various components of device 1200. Merely as an example, battery 1218 is illustrated to be supplying power to processor 1204. Although not illustrated in the figures, device 1200 may comprise a charging circuitry, e.g., to recharge the battery, based on Alternating Current (AC) power supply received from an AC adapter.

In some embodiments, device 1200 comprises Power Control Unit (PCU) 1210 (also referred to as Power Management Unit (PMU), Power Controller, etc.). In an example, some sections of PCU 1210 may be implemented by one or more processing cores 1208, and these sections of PCU 1210 are symbolically illustrated using a dotted box and labelled PCU 1210*a*. In an example, some other sections of PCU 1210 may be implemented outside the processing cores 1208, and these sections of PCU 1210 are symbolically illustrated using a dotted box and labelled as PCU 1210*b*. PCU 1210 may implement various power management operations for device 1200. PCU 1210 may include hardware interfaces, hardware circuitries, connectors, registers, etc., as well as software components (e.g., drivers, protocol stacks), to implement various power management operations for device 1200.

In some embodiments, device 1200 comprises Power Management Integrated Circuit (PMIC) 1212, e.g., to implement various power management operations for device 1200. In some embodiments, PMIC 1212 is a Reconfigurable Power Management ICs (RPMICs) and/or an IMVP (Intel® Mobile Voltage Positioning). In an example, the PMIC is within an IC chip separate from processor 1204. The may implement various power management operations for device 1200. PMIC 1212 may include hardware interfaces, hardware circuitries, connectors, registers, etc., as well as software components (e.g., drivers, protocol stacks), to implement various power management operations for device 1200.

In an example, device 1200 comprises one or both PCU 1210 or PMIC 1212. In an example, any one of PCU 1210 or PMIC 1212 may be absent in device 1200, and hence, these components are illustrated using dotted lines.

Various power management operations of device 1200 may be performed by PCU 1210, by PMIC 1212, or by a combination of PCU 1210 and PMIC 1212. For example, PCU 1210 and/or PMIC 1212 may select a power state (e.g., P-state) for various components of device 1200. For example, PCU 1210 and/or PMIC 1212 may select a power state (e.g., in accordance with the ACPI (Advanced Configuration and Power Interface) specification) for various components of device 1200. Merely as an example, PCU 1210 and/or PMIC 1212 may cause various components of the device 1200 to transition to a sleep state, to an active state, to an appropriate C state (e.g., C0 state, or another appropriate C state, in accordance with the ACPI specification), etc. In an example, PCU 1210 and/or PMIC 1212 may control a voltage output by VR 1214 (e.g., SCVR) and/or a frequency of a clock signal output by the clock generator, e.g., by outputting the VID signal and/or the FID signal, respectively. In an example, PCU 1210 and/or PMIC 1212 may control battery power usage, charging of battery 1218, and features related to power saving operation.

The clock generator 1216 can comprise a phase locked loop (PLL), frequency locked loop (FLL), or any suitable clock source. In some embodiments, each core of processor 1204 has its own clock source. As such, each core can operate at a frequency independent of the frequency of operation of the other core. In some embodiments, PCU 1210 and/or PMIC 1212 performs adaptive or dynamic frequency scaling or adjustment. For example, clock frequency of a processor core can be increased if the core is not operating at its maximum power consumption threshold or limit. In some embodiments, PCU 1210 and/or PMIC 1212 determines the operating condition of each core of a processor, and opportunistically adjusts frequency and/or power supply voltage of that core without the core clocking source (e.g., PLL of that core) losing lock when the PCU 1210 and/or PMIC 1212 determines that the core is operating below a target performance level. For example, if a core is drawing current from a power supply rail less than a total current allocated for that core or processor 1204, then PCU 1210 and/or PMIC 1212 can temporality increase the power draw for that core or processor 1204 (e.g., by increasing clock frequency and/or power supply voltage level) so that the core or processor 1204 can perform at higher performance level. As such, voltage and/or frequency can be increased temporality for processor 1204 without violating product reliability.

In an example, PCU 1210 and/or PMIC 1212 may perform power management operations, e.g., based at least in part on receiving measurements from power management circuitries 1242, temperature measurement circuitries 1240, charge level of battery 1218, and/or any other appropriate information that may be used for power management. To that end, PMIC 1212 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 1210 and/or PMIC 1212 in at least one embodiment to allow PCU 1210 and/or PMIC 1212 to manage processor core energy at least in part based on value(s) detected by one or more of the sensors.

Also illustrated is an example software stack of device 1200 (although not all elements of the software stack are illustrated). Merely as an example, processors 1204 may execute application programs 1250, Operating System 1252, one or more Power Management (PM) specific application programs (e.g., generically referred to as PM applications 1258), and/or the like. PM applications 1258 may also be executed by the PCU 1210 and/or PMIC 1212. OS 1252 may also include one or more PM applications 1256*a*, 1256*b*, 1256*c*. The OS 1252 may also include various drivers 1254*a*, 1254*b*, 1254*c*, etc., some of which may be specific for power management purposes. In some embodiments, device 1200 may further comprise a Basic Input/Output System (BIOS) 1220. BIOS 1220 may communicate with OS 1252 (e.g., via one or more drivers 1254), communicate with processors 1204, etc.

For example, one or more of PM applications 1258, 1256, drivers 1254, BIOS 1220, etc. may be used to implement power management specific tasks, e.g., to control voltage and/or frequency of various components of device 1200, to control wake-up state, sleep state, and/or any other appropriate power state of various components of device 1200, control battery power usage, charging of the battery 1218, features related to power saving operation, etc.

In some embodiments, device 1200 comprises a dual-stacked high voltage driver circuit comprising over-voltage protection circuitry, e.g., the dual-stacked high voltage driver circuit 300 illustrated in FIG. 3 or the dual-stacked high voltage driver circuit 400 illustrated in FIG. 4. In some embodiments, device 1200 comprises the N-stacked high voltage driver circuit 500 illustrated in FIG. 5. A high voltage driver circuit comprising over-voltage protection circuitry may be included in any of the circuits of device 1200, e.g., processor 1204, power management circuitries 1242, or temperature measurement circuitries 1240.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

In the foregoing description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. A module may comprise a circuit or circuitry, as defined below. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

The terms "functional block," "functional unit," or "component" herein generally refer to any circuitry that performs a particular function. A "functional block" or "component" may be a unit of logic, circuit, cell, or chip layout that is reusable. A functional block is sometimes colloquially referred to as an IP (intellectual property) block. A few examples of functional blocks or components include processor cores, memories, caches, floating point processors, memory controllers, bus controllers, graphics processors, transceivers, network interface controllers, and display controllers. One or more portions of a larger functional block can themselves be designated as functional blocks. For example, an instruction execution unit and cache controller can be functional units or components of a processor functional unit. It should be appreciated that the foregoing examples are a non-exhaustive list of functional blocks.

As used herein, the terms "circuit" and "circuitry" comprise various electronic and electrical devices ("hardware"). Examples of hardware include analog circuits and analog circuit components (e.g., resistors, capacitors, inductors, diodes, and transistors). Other examples of hardware include digital circuits and digital circuit components, such as logic devices implementing Boolean functions. Examples of digital circuits include programmable logic devices (PLD), field programmable gate arrays (FPGA), application specific integrated circuits (ASIC), processors, processor cores, microprocessors, microcontrollers, digital signal processors (DSP), and graphics processing units (GPU). In yet another example, hardware includes a circuit that may be synthesized using a hardware description language (HDL) and which implements a state machine or other logic circuit. It should be understood that when hardware executes instructions stored in a memory device, the term hardware includes the stored instructions. Additional examples of hardware include volatile and non-volatile memory devices, such as registers, read-only memory (ROM), random access memory (RAM), and flash memory. Circuits and circuitry can include two or more instances of circuitry. Circuits and circuitry may comprise a combination of hardware elements that cooperate to provide one or more functions. A particular instance of a circuits and circuitry may be referred to with a descriptive or non-descriptive label. For example, instances of circuits and circuitry that perform various functions may be referred to as receiver circuitry, processor circuitry, first circuit, or second circuit. Each of two or more instances of a circuit and circuitry can be comprised of distinct components. In addition, two or more instances of a circuit or circuitry can share one or more common components or resources.

As used herein, the term "hardware interface" refers to one or more physical components of a given device, where said one or more physical components accommodate coupling to interact with one or more physical components of another device. For example, a hardware interface may comprise conductive contacts of a connector or a socket that receives a connector. As another example, a hardware interface may comprise metal contacts, pads, metallization features, or other interconnect structures on a surface of or within a circuit board or integrated circuit (IC) chip. As a further example, a hardware interface may comprise an interconnect between contacts of respective components, such as solder or an interposer.

Following examples are provided to illustrate the various embodiments. These examples can depend from one another in any suitable manner.

Example 1: An apparatus comprising: a first supply node to provide a first voltage; a second supply node to provide a second voltage lower than the first voltage; a first transistor and a second transistor coupled in series at a first common node, wherein the first transistor and the second transistor are of a first conductivity type, the first transistor is coupled to the first supply node, and the second transistor is coupled to an output node; a third transistor and a fourth transistor coupled in series at a second common node, wherein the fourth transistor and the third transistor are of a second conductivity type, the fourth transistor is coupled to a third node that is to provide a third voltage, and the third transistor is coupled to the output node; and first impedance circuitry coupled to a gate terminal of the second transistor, the second supply node, and to a gate terminal of the first transistor.

Example 2: The apparatus of example 1, wherein the first impedance circuitry comprises: a fifth transistor of the second conductivity type coupled to the gate of the second transistor and the second supply node, wherein a gate terminal of the fifth transistor is coupled to the gate terminal of the first transistor.

Example 3: The apparatus of example 1 or example 2, wherein the first impedance circuitry comprises: a sixth transistor of the second conductivity type coupled to the gate terminal of the second transistor and the second supply node, wherein a gate terminal of the sixth transistor is coupled to the first common node.

Example 4: The apparatus of any one of examples 1 to 3, further comprising second impedance circuitry coupled to a gate terminal of the third transistor, the second supply node, and to a gate terminal of the fourth transistor, wherein the second circuitry comprises: a seventh transistor of the first conductivity type coupled to the gate of the third transistor and the second supply node, wherein a gate terminal of the seventh transistor is coupled to a gate terminal of the fourth transistor; and an eighth transistor of the first conductivity type coupled to the gate terminal of the third transistor and the second supply node, wherein a gate terminal of the eighth transistor is coupled to the second common node.

Example 5: The apparatus of any one of examples 1 to 4, further comprising: a first feedback transistor of the first conductivity type coupled to the first common node and to the second supply node, wherein a gate terminal of the first feedback transistor is coupled to the output node.

Example 6: The apparatus of any one of examples 1 to 5, further comprising: a first capacitor coupled with a gate terminal of the first transistor and the gate terminal of the second transistor.

Example 7: The apparatus of example 6, wherein the first capacitor comprises features of a first size, the second transistor comprises features of a second size, and the first size is proportional to the second size.

Example 8: The apparatus of any one of examples 1 to 7, wherein a gate terminal of the first transistor is coupled to a first input signal and a gate terminal of the fourth transistor is coupled to a second input signal.

Example: The apparatus of any one of examples 1 to 8, wherein the second transistor is a fin field effect transistor.

Example 10: An apparatus comprising: a first supply node to provide a first voltage; a second supply node to provide a second voltage lower than the first voltage; a first transistor and a second transistor coupled in series at a first common node, wherein the first transistor and the second transistor are of a first conductivity type, the first transistor is coupled to the first supply node, and the second transistor is coupled to an output node; a third transistor and a fourth transistor coupled in series at a second common node, wherein the fourth transistor and the third transistor are of a second conductivity type, the fourth transistor is coupled to a third node that is to provide a third voltage, and the third transistor is coupled to the output node; first impedance circuitry coupled to a gate terminal of the second transistor and the second supply node, and a gate terminal of the first transistor; and a first feedback transistor of the first conductivity type coupled to the first common node and to the second supply node, and comprising a gate terminal coupled to the output node.

Example 11: The apparatus of example 10, wherein the first impedance circuitry comprises one of a pass-gate circuit or a resistor.

Example 12: The apparatus of example 10, wherein the first impedance circuitry comprises: a fifth transistor of the second conductivity type coupled to the gate of the second transistor and the second supply node, wherein a gate terminal of the fifth transistor is coupled to the gate terminal of the first transistor; and a sixth transistor of the second conductivity type coupled to the gate terminal of the second transistor and the second supply node, wherein a gate terminal of the sixth transistor is coupled to the first common node.

Example 13: The apparatus of any one of examples 10 to 12, further comprising: a first capacitor coupled with a gate terminal of the first transistor and the gate terminal of the second transistor.

Example 14: The apparatus of example 13, wherein the first capacitor comprises features of a first size, the second transistor comprises features of a second size, and the first size is proportional to the second size.

Example 15: The apparatus of any one of examples 10 to 14, wherein a gate terminal of the first transistor is coupled to a first input signal and a gate terminal of the fourth transistor is coupled to a second input signal.

Example 16: An apparatus comprising: a first supply node to provide a first voltage; a second supply node to provide a second voltage lower than the first voltage; a first stack of transistors, of a first conductivity type, comprising a first transistor and a second transistor coupled in series at a first common node, wherein the first transistor is coupled to the first supply node and a gate terminal of the first transistor is coupled to a first input signal; a second stack of transistors, of a second conductivity type, comprising a third transistor and a fourth transistor coupled in series at a second common node, wherein the fourth transistor is coupled to a third node that is to provide a third voltage and a gate terminal of the fourth transistor is coupled to a second input signal, wherein the second stack of transistor is coupled in series to the first stack of transistors at an output node; and first impedance circuitry, coupled to a gate terminal of the second transistor and the second supply node, controllable by the first input signal.

Example 17: The apparatus of example 16, wherein the first stack of transistors further comprises a fifth transistor coupled in series at a third common node with the second transistor, and the second stack of transistors further comprises a sixth transistor coupled in series at a fourth common node with the third transistor.

Example 18: The apparatus of example 16 or example 17, wherein the first impedance circuitry comprises: a seventh transistor of the second conductivity type coupled to the gate of the second transistor and the second supply node, wherein a gate terminal of the seventh transistor is coupled to the gate terminal of the first transistor; and an eighth transistor of the second conductivity type coupled to the gate terminal of the second transistor and the second supply node, wherein a gate terminal of the eighth transistor is coupled to the first common node.

Example 19: The apparatus of any one of examples 16 to 18, wherein the first impedance circuitry is further controllable by a voltage at the first common node.

Example 20: The apparatus of any one of examples 16 to 19, further comprising: a first capacitor coupled with a gate terminal of the first transistor and the gate terminal of the second transistor; and a first feedback transistor of the first conductivity type coupled to the first common node and to the second supply node, wherein a gate terminal of the first feedback transistor is coupled to the output node.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment

We claim:

1. An apparatus comprising:

a first supply node to provide a first voltage;

a second supply node to provide a second voltage lower than the first voltage;

a first transistor and a second transistor coupled in series at a first common node, wherein the first transistor and the second transistor are of a first conductivity type, the first transistor is coupled to the first supply node, and the second transistor is coupled to an output node;

a third transistor and a fourth transistor coupled in series at a second common node, wherein the fourth transistor and the third transistor are of a second conductivity type, the fourth transistor is coupled to a third node that is to provide a third voltage, and the third transistor is coupled to the output node;

first impedance circuitry coupled to a gate terminal of the second transistor, the second supply node, and to a gate terminal of the first transistor; and a first capacitor coupled between a gate terminal of the first transistor and the gate terminal of the second transistor.

2. The apparatus of claim 1, wherein the first impedance circuitry comprises:

a fifth transistor of the second conductivity type coupled to the gate of the second transistor and the second supply node, wherein a gate terminal of the fifth transistor is coupled to the gate terminal of the first transistor.

3. The apparatus of claim 2, wherein the first impedance circuitry comprises:

a sixth transistor of the second conductivity type coupled to the gate terminal of the second transistor and the second supply node, wherein a gate terminal of the sixth transistor is coupled to the first common node.

4. The apparatus of claim 3, further comprising second impedance circuitry coupled to a gate terminal of the third transistor, the second supply node, and to a gate terminal of the fourth transistor, wherein the second circuitry comprises:

a seventh transistor of the first conductivity type coupled to the gate of the third transistor and the second supply node, wherein a gate terminal of the seventh transistor is coupled to a gate terminal of the fourth transistor; and an eighth transistor of the first conductivity type coupled to the gate terminal of the third transistor and the second supply node, wherein a gate terminal of the eighth transistor is coupled to the second common node.

5. The apparatus of claim 1, further comprising:

a first feedback transistor of the first conductivity type coupled to the first common node and to the second supply node, wherein a gate terminal of the first feedback transistor is coupled to the output node.

6. The apparatus of claim 1, wherein the first capacitor comprises features of a first size, the second transistor comprises features of a second size, and the first size is proportional to the second size.

7. The apparatus of claim 1, wherein a gate terminal of the first transistor is coupled to a first input signal and a gate terminal of the fourth transistor is coupled to a second input signal.

8. The apparatus of claim 1, wherein the second transistor is a fin field effect transistor.

9. An apparatus comprising:

a first supply node to provide a first voltage;

a second supply node to provide a second voltage lower than the first voltage;

a first transistor and a second transistor coupled in series at a first common node, wherein the first transistor and the second transistor are of a first conductivity type, the first transistor is coupled to the first supply node, and the second transistor is coupled to an output node;

a third transistor and a fourth transistor coupled in series at a second common node, wherein the fourth transistor and the third transistor are of a second conductivity type, the fourth transistor is coupled to a third node that is to provide a third supply reference voltage, and the third transistor is coupled to the output node;

first impedance circuitry coupled to a gate terminal of the second transistor and the second supply node, and a gate terminal of the first transistor;

a first feedback transistor of the first conductivity type coupled to the first common node and to the second supply node, and comprising a gate terminal coupled to the output node; and a first capacitor coupled between a gate terminal of the first transistor and the gate terminal of the second transistor.

10. The apparatus of claim 9, wherein the first impedance circuitry comprises one of a pass-gate circuit or a resistor.

11. The apparatus of claim 9, wherein the first impedance circuitry comprises:

a fifth transistor of the second conductivity type coupled to the gate of the second transistor and the second supply node, wherein a gate terminal of the fifth transistor is coupled to the gate terminal of the first transistor; and a sixth transistor of the second conductivity type coupled to the gate terminal of the second transistor and the second supply node, wherein a gate terminal of the sixth transistor is coupled to the first common node.

12. The apparatus of claim 9, wherein the first capacitor comprises features of a first size, the second transistor comprises features of a second size, and the first size is proportional to the second size.

13. The apparatus of claim 9, wherein a gate terminal of the first transistor is coupled to a first input signal and a gate terminal of the fourth transistor is coupled to a second input signal.

14. An apparatus comprising:

a first supply node to provide a first voltage;

a second supply node to provide a second voltage lower than the first voltage;

a first stack of transistors, of a first conductivity type, comprising a first transistor and a second transistor coupled in series at a first common node, wherein the first transistor is coupled to the first supply node and a gate terminal of the first transistor is coupled to a first input signal;

a second stack of transistors, of a second conductivity type, comprising a third transistor and a fourth transistor coupled in series at a second common node, wherein the fourth transistor is coupled to a third node that is to provide a third voltage and a gate terminal of the fourth transistor is coupled to a second input signal, wherein the second stack of transistor is coupled in series to the first stack of transistors at an output node;

first impedance circuitry, coupled to a gate terminal of the second transistor and the second supply node, controllable by the first input signal; and a first capacitor coupled between a gate terminal of the first transistor and the gate terminal of the second transistor.

15. The apparatus of claim 14, wherein the first stack of transistors further comprises a fifth transistor coupled in series at a third common node with the second transistor, and the second stack of transistors further comprises a sixth transistor coupled in series at a fourth common node with the third transistor.

16. The apparatus of claim 15, wherein the first impedance circuitry comprises:

a seventh transistor of the second conductivity type coupled to the gate of the second transistor and the second supply node, wherein a gate terminal of the seventh transistor is coupled to the gate terminal of the first transistor; and an eighth transistor of the second conductivity type coupled to the gate terminal of the second transistor and the second supply node, wherein a gate terminal of the eighth transistor is coupled to the first common node.

17. The apparatus of claim 14, wherein the first impedance circuitry is further controllable by a voltage at the first common node.

18. The apparatus of claim 14, further comprising:

a first feedback transistor of the first conductivity type coupled to the first common node and to the second supply node, wherein a gate terminal of the first feedback transistor is coupled to the output node.

* * * * *